(12) United States Patent
Gupta

(10) Patent No.: US 6,509,853 B2
(45) Date of Patent: Jan. 21, 2003

(54) SUBRANGING TECHNIQUE USING SUPERCONDUCTING TECHNOLOGY

(75) Inventor: Deepnarayan Gupta, Hawthorne, NY (US)

(73) Assignee: Hypres, Inc., Elmsford, NY (US)

(*) Notice: Subject to any disclaimer, the term of this patent is extended or adjusted under 35 U.S.C. 154(b) by 0 days.

(21) Appl. No.: 09/950,993

(22) Filed: Sep. 13, 2001

(65) Prior Publication Data

US 2002/0060635 A1 May 23, 2002

Related U.S. Application Data

(60) Provisional application No. 60/232,931, filed on Sep. 15, 2000.

(51) Int. Cl.[7] .................................................. H03M 1/72
(52) U.S. Cl. ........................................ 341/133; 341/155
(58) Field of Search ................................. 341/133, 155, 341/156, 172, 145

(56) References Cited

U.S. PATENT DOCUMENTS 5,731,775 A * 3/1998 Gross .......................... 341/155

* cited by examiner

Primary Examiner—Brian Young
(74) Attorney, Agent, or Firm—Henry I. Schanzer

(57) ABSTRACT

Subranging techniques using "digital SQUIDs" are used to design systems with large dynamic range, high resolution and large bandwidth. Analog-to-digital converters (ADCs) embodying the invention include a first SQUID based "coarse" resolution circuit and a second SQUID based "fine" resolution circuit to convert an analog input signal into "coarse" and "fine" digital signals for subsequent processing. In one embodiment, an ADC includes circuitry for supplying an analog input signal to an input coil having at least a first inductive section and a second inductive section. A first superconducting quantum interference device (SQUID) is coupled to the first inductive section and a second SQUID is coupled to the second inductive section. The first SQUID is designed to produce "coarse" (large amplitude, low resolution) output signals and the second SQUID is designed to produce "fine" (low amplitude, high resolution) output signals in response to the analog input signals.

27 Claims, 21 Drawing Sheets

SUBRANGING TECHNIQUE USING SUPERCONDUCTING TECHNOLOGY

BACKGROUND OF THE INVENTION

This application claims the benefit of U.S. Provisional Application Ser. No. 60/232931 filed Sep. 9, 2000.

This invention was made with government support under contract No. DE-FG02-98ER82799 from the Department Of Energy. The government has certain rights in this invention.

Precise measurement of current is necessary in many applications. It is desirable to develop a high-precision, non-interceptive current (or flux) measuring scheme based on a digital SQUID (Superconducting QUantum Interference Device) technology. The advantage of using SQUIDs, in general, and digital SQUID, in particular, is that this technology not only improves the dynamic range of measurement systems, but also reduces the cost and complexity of supporting, peripheral electronics. Another desirable feature is that the digital nature of the outputs lends itself to digital signal processing, naturally.

The following examples illustrate some applications in a nuclear facility accelerator facility where high resolution over a wide range of signal amplitude is desirable.

1) Beam Current Monitor (BCM)

The average circulating beam current must be measured to a very high precision ($10^{-4}$-$10^{-6}$). This measurement can provide important information about particle losses in a beam. Even small deviations in the average beam current must be diagnosed to ensure stability of the beam. Depending on the particulars of an accelerator, the maximum average beam current can range from 100 $\mu$A to 100 mA. Therefore, a current resolution of about 10 nA is needed.

2) Beam-in-Gap Monitor (BIG)

The measurement of gap current, which is $10^4$-$10^5$ times smaller than the peak bunch current, is another demanding application. In the SNS (Spallation Neutron Source) ring, the bunch currents can be as high as 100 A. However, gap currents in the mA range must be measured accurately to determine the fraction of the beam outside the bunch. Since the gap duration is 250–300 ns, the measurement bandwidth must be at least several MHz. This is an extremely challenging task in terms of both dynamic range ($10^5$) and slew rate of the measurement instrument.

3) Beam Polarization Measurement

Direct measurement of beam polarization can be made if the magnetic flux produced by the aligned dipole moments in a polarized beam can be measured. This is difficult because the magnetic fields produced by the charged particle are $10^{10}$-$10^{15}$ times larger. An extremely high resolution measurement instrument is needed to measure such a small signal in the presence of an overwhelming background. By careful design of the pick-up coil, the background signal can be reduced to about $10^8$ times the polarization signal. Still, detecting this signal will require about 27 bits of resolution.

SUMMARY OF THE INVENTION

Applicant's invention is directed to a subranging architecture using digital SQUID (Superconducting QUantum Interference Device) technology to design systems with larger dynamic range, higher resolution and larger bandwidth than existing systems. Systems embodying the invention may be used to manufacture (current or magnetic flux) measuring instruments useful in a diverse range of applications requiring high resolution and the sensing of signals over a wide range of signal amplitude.

An analog-to-digital converter (ADC) embodying the invention includes circuitry for supplying an analog input signal to an input coil having at least a first inductive section and a second inductive section. A first superconducting quantum interference device (SQUID) is coupled to the first inductive section and a second SQUID is coupled to the second inductive section. The first SQUID is designed to produce "coarse" (large amplitude, low resolution) output signals and the second SQUID is designed to produce "fine" (low amplitude, high resolution) output signals in response to the analog input signals. The output signals of the first SQUID are coupled to a first comparator having an output for producing a first quantized output signal which is coupled back to the input coil. The output signals of the second SQUID are coupled to a second comparator having an output for producing a second quantized output signal which is also coupled back to the input coil.

In one embodiment of the invention first and second clock signals are respectively applied to the first and second comparators for enabling one of them at a time. In certain embodiments, the first and second inductive sections are connected in series. Typically, the inductance of the second inductive section is greater than the inductance of the first inductive section for causing the first SQUID and the first comparator to produce a "coarse" output and the second SQUID and the second comparator to produce a "fine" output.

In an embodiment of the invention each one of the first and second comparators is a superconducting comparator; with each one of the first and second comparators being responsive to an output signal of its corresponding SQUID and to a clock signal for producing first and second comparator complementary output signals. The first output signal of each comparator is coupled to a first write gate and the second output signal of each comparator is coupled to a second write gate. The first write gate produces a comparator output signal of one binary value and the second write gate produces a comparator output signal of a second binary value, with the output signals of the first and second comparators being fed back to the input coil and to processing circuitry.

In a subranging superconducting ADC embodying the invention each one of the first and second comparators includes a digital output, with the digital output of the first comparator defining the more significant bits and the digital output of the second comparator defining the lesser significant bits of the digitally converted signal.

The digital output of each comparator may be coupled to an up-down counter, with each up-down counter having an output coupled to an accumulator whose output is coupled to a processor for processing the data digitally. The processor may include a digital filter and data acquisition and software for analyzing the data.

A subranging superconducting ADC embodying the invention may also include a first circuit arrangement for producing "coarse" (high amplitude, low resolution) output signals and a second circuit arrangement for producing "fine" (low amplitude, high resolution) output signals. The first circuit arrangement includes circuitry for supplying an analog input signal to a first inductor for inductively coupling the analog input signal to a first SQUID based circuit. An output of the first SQUID based circuit is coupled to a first digital filter for producing a "coarse" digital signal. The second circuit arrangement includes circuitry for subtracting an output of the first SQUID based circuit from the analog input signal and applying the resultant analog signal to a second SQUID based circuit. An output of the second SQUID based circuit is supplied to a second digital filter for producing a "fine" digital signal.

In one embodiment, the circuitry for subtracting an output of the first SQUID based circuit from the analog input signal includes an analog delay line for coupling the analog input signal to a second inductor and a digital variable delay network having an input connected to the output of the first SQUID based circuit and having an output connected to the input of a digital-to-analog converter (DAC) with the output of the DAC being connected to a third inductor and supplying a signal thereto tending to cause the output of the first SQUID based circuit to be subtracted from the analog input signal developed across the second inductor.

BRIEF DESCRIPTION OF THE DRAWINGS

In the accompanying drawings, like reference characters denote like components.

FIG. 4A is semi-schematic, semi-block diagram of a comparator circuit with two thresholds useable in circuits embodying the invention;

DETAILED DESCRIPTION OF THE INVENTION

In the discussion to follow, it should be understood that "Sensitivity" of a measuring device is the smallest signal that can be detected in the presence of noise. SQUIDs are very sensitive measurement devices for magnetic flux. Resolution is a property of a digital device and refers to the smallest discrete level. This is also referred to as the least significant bit (LSB). The fundamental flux resolution of a SQUID-based device is a single flux quantum (F0 or $\Phi 0$), but the resolution of an ADC can be improved further through digital filtering if the sampling frequency is higher than the twice the signal bandwidth (Table 1).

Figure 1A:
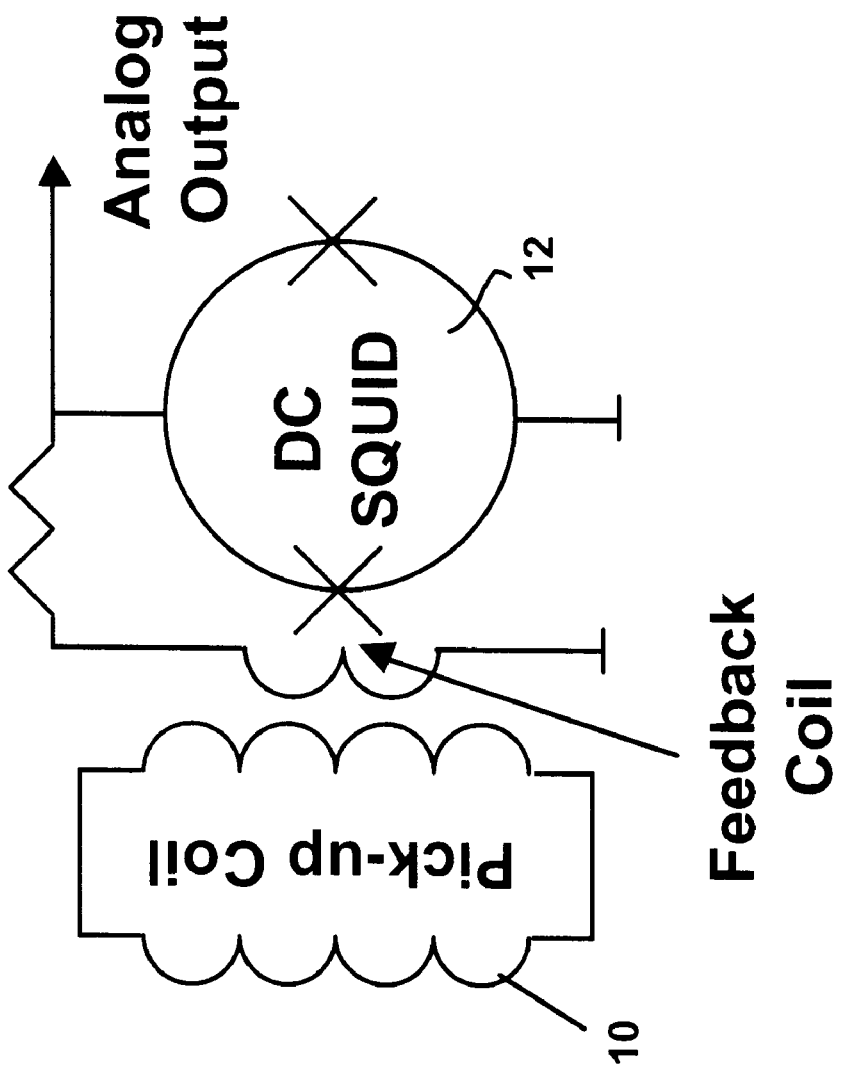
FIG. 1(a) is a schematic diagram of a prior art analog SQUID with feedback.

Measurement of the characteristics of a signal current can be made by measuring the magnetic flux it produces in a pick-up loop (e.g., 10 in FIG. 1(a)). A very precise measurement of magnetic flux ($\Phi$) can be performed with a SQUID (Superconducting Quantum Interference Device).

Figure 1B:
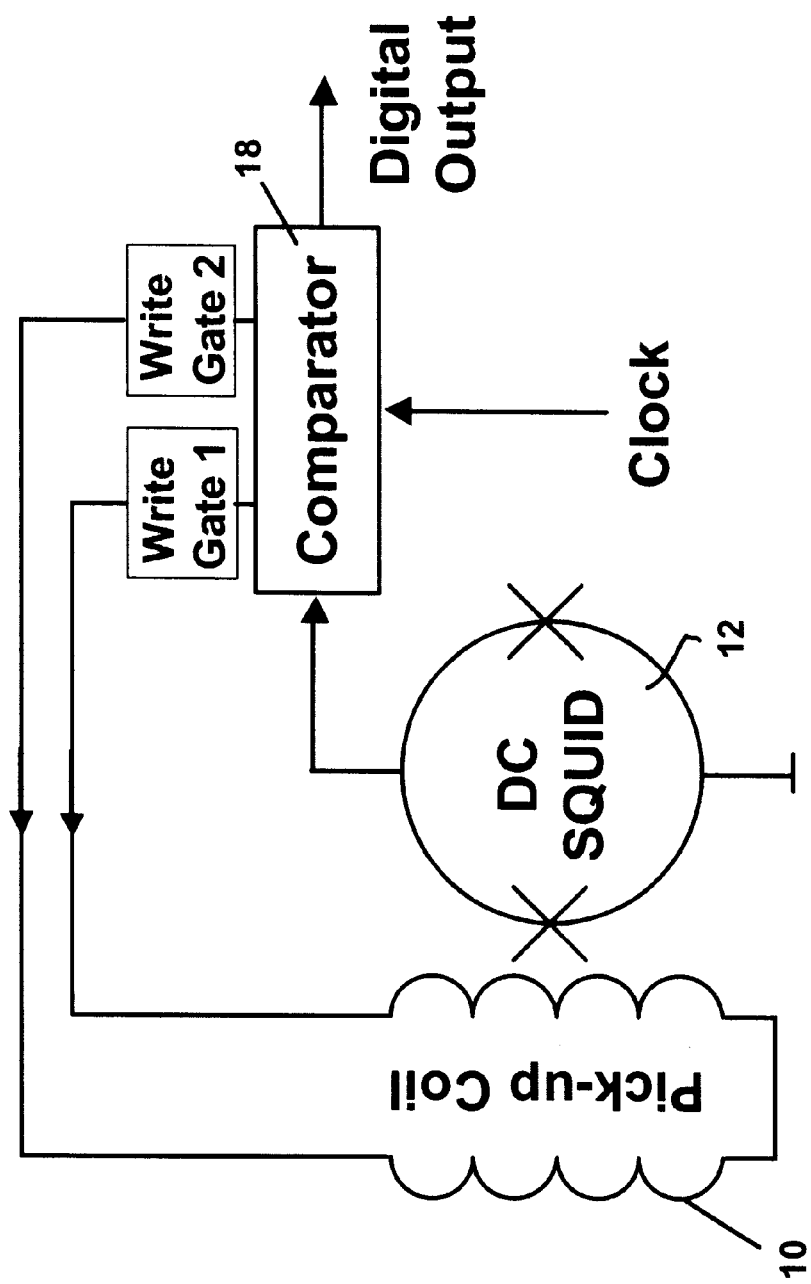
FIG. 1(b) is a schematic diagram of a prior art digital SQUID using a 1-bit delta modulator scheme.

The magnetic flux in a SQUID (e.g., 12 in FIG. 1(a)) causes a voltage (V) to appear across it. [Note that in FIGS. 1(a) and 1(b) and in all the other drawings, the symbol "X" in a drawing is used to specifically identify the presence of a Josephson junction (J or JJ).] A SQUID is a non-linear device with a periodic transfer characteristic (V-$\Phi$ curve). To increase the dynamic range of a SQUID amplifier, the transfer function must be linearized by using feedback. As shown in FIG. 1(a) a common method of achieving this is to magnetically couple a pick up coil 10 with a feedback coil, carrying a current proportional to V, to the SQUID. This feedback can be done either using on-chip circuitry or through external, room temperature electronics.

The SQUID 12 is biased in the center of the linear region of its V-$\Phi$ curve. As the externally applied flux ($\Phi$) increases, the voltage (V) across the SQUID also increases, resulting in a proportional increase in the feedback current. The feedback current produces magnetic flux, equal and opposite to the input flux, in the SQUID. By measuring the feedback current, the externally applied flux and the current producing that flux can be calculated. This is a null detection scheme.

Figure 2:
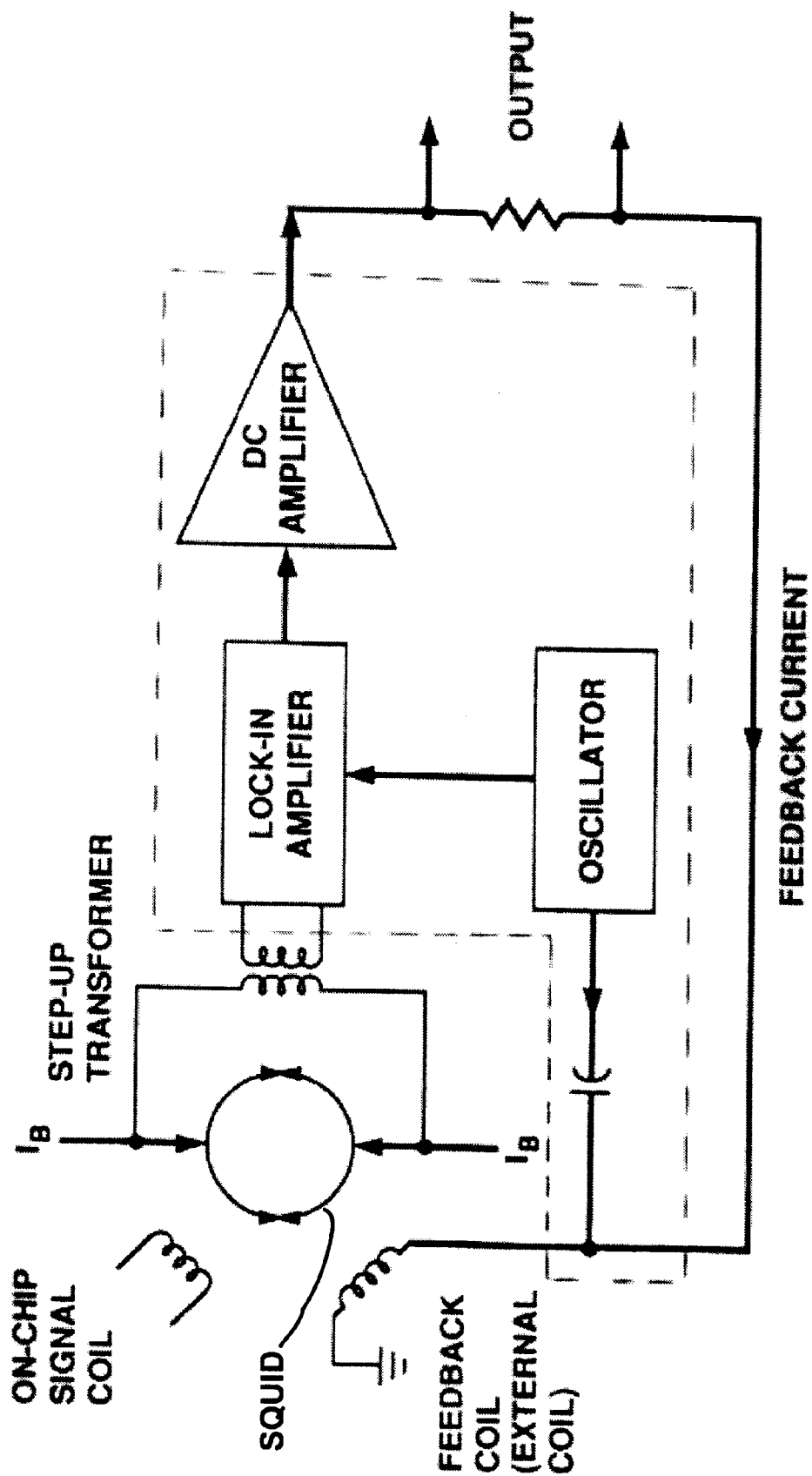
FIG. 2 is a schematic diagram of a prior art feedback circuit to linearize the transfer characteristic of an analog SQUID.

FIG. 2 shows a common measurement configuration, which may be referred to as a flux-locked loop, where an ac signal from an oscillator is added to the feedback current to facilitate a narrow-band lock-in measurement. Usually the transformer turns ratio between the SQUID and the signal/feedback coil is high, of the order of 100. Therefore, small errors in measurement in the SQUID are manifested as large ones in the current through the feedback network. The output is the feedback current required to produce the same amount of flux in the SQUID induced by the input (signal) coil.

The major disadvantages of this method are:
1) Limited dynamic range dependent on current-carrying capacity in the feedback coil,
2) Analog output that may require analog-to-digital conversion for further signal processing,
3) Expensive peripheral electronics, and
4) Large errors.

Digitizing the SQUID output and providing a digital feedback is desirable to improve the -dynamic range and produce digital outputs. This may be done as shown in FIG. 1(b). There are many methods of implementing a digital SQUID; where a "digital SQUID" as used herein includes an analog SQUID whose output is coupled to a circuit, such as a comparator, to produce a digital output signal which is fed back to the input of the analog SQUID. However, a desirable and relatively simple scheme may be used as shown in FIG. 1(b) and which is referred to as a 1-bit delta modulator 18. In this scheme, the analog dc SQUID 12 is magnetically coupled to a clocked comparator circuit. The feedback is in the form of single flux quanta (SFQ) injected directly into the pick-up coil loop 10.

The operation of the 1-bit delta modulator is briefly outlined as follows: In the absence of an external flux, the comparator 18 switches to a voltage state and causes write gate 1 to induce a single flux quantum ($\Phi_0$=h/2e=2.07×10$^{-15}$ Wb) into the pick-up loop. This flux is sensed by the analog SQUID and is applied back to the comparator. In the following clock cycle, this magnetic field keeps the comparator from switching and causes the write gate 2 to switch and, hence, it induces an antifluxon (–$\Phi_0$) in the loop annihilating the original fluxon. As long as there is no applied flux, this process of fluxon/antifluxon creation/annihilation continues. This is the steady state operation of the 1-bit delta modulator circuit.

Depending on the polarity of the input flux (or current), the comparator circuit injects either +$\Phi_0$ or –$\Phi_0$ directly into the input coil through one of the two write gates. For example, if the input flux is positive, the comparator produces –$\Phi_0$ into "write gate 2" when a clock pulse arrives. This causes partial cancellation of the flux in the input coil. The process continues until the flux in the loop falls below the threshold of the comparator. Any change in the value of the input flux is tracked in steps of $\Phi_0$. As long as the flux does not change by more than $\Phi_0$ in a clock period—the slew rate limit—the SQUID output faithfully tracks the flux. The digital output of the comparator is synchronized with the clock. By counting the digital output, the externally applied flux (or current) can be measured.

Since the feedback is quantized, so is the resolution of the digital SQUID. The flux resolution is $\Phi_0$ (2.07 fWb=2.07 nA·$\mu$H). The current resolution ($\Delta$I) depends on the inductance ($L_1$) of the input coil. For an input inductance of the pickup coil of 1 $\mu$H, $\Delta$I=$\Phi_0$/$L_1$≈2 nA. Thus, the resolution can be changed by varying the input inductance. In circuits embodying the invention this feature is used to produce digital SQUIDs of "coarse" and "fine" resolutions.

In calculations of current resolution thus far, only the raw resolution was considered. For low-bandwidth and dc measurements, such as average beam current monitoring, higher resolution can be obtained by exploiting over sampling.

If the clock frequency is higher than the Nyquist rate for a given bandwidth, the resolution can be improved further by averaging the output. A digital filter can be employed to perform this averaging. The resolution improves by a factor of $\sqrt{\alpha}$, where $\alpha$ is the over sampling ratio (OSR). If the input bandwidth is 100 Hz, corresponding to a Nyquist frequency of 200 Hz, and the clock frequency is 200 MHz, $\alpha$=10$^6$. In that case, the resolution can be improved by a factor of 1000. For the example above, the current resolution becomes 2 pA. While extremely high resolution is possible for a direct current (dc) measurement, the current resolution is ultimately limited by the noise in the SQUID. The digital SQUID technology, in the present implementation, is ideal for extremely high-resolution measurement of slow signals. If high-resolution measurement of signals with MHz bandwidths is desired, a more complex version of the circuit with on-chip RSFQ digital filter can be used in conjunction with a clock frequency in the GHz range.

The slew rate of the digital SQUID is proportional to the clock frequency ($f_c$) and is equal to $\Phi_0 \times f_c/N$ where N is the transformer turns ratio between the input coil and the SQUID. In analog SQUID, slew rates of 10$^6$ $\Phi_0$/s are possible. To achieve the same slew rate in a digital SQUID with a 100-turn transformer, a clock frequency of 100 MHz is needed. The input current slew rate $\Phi_0 \times f_c/L_1$ is 0.2 A/s for a 1 $\mu$H input inductance. The sensitivity of a digital SQUID is the same as the analog dc SQUID it uses, and is in the range of 10$^{-5}$-10$^{-6}$ $\Phi_0$/$\sqrt{Hz}$. Another advantage of a digital SQUID is the digital nature of the output. The digital output helps simplify the processing electronics considerably. It also enables more freedom in signal processing. For example, a programmable digital filter can be used to vary the measurement bandwidth.

Table 1 shows a comparison of the different parameters of the analog [e.g., FIG. 1(a)] and the digital [e.g., FIG. 1(b)] SQUID. The unlimited dynamic range and high-resolution digital output are the two major advantages of the digital SQUID. These can be exploited to implement a superior instrument for precise measurement of magnetic flux and, therefore, other quantities like current, magnetic field and voltage.

TABLE 1

Comparison of analog and digital SQUID

| Parameter | Analog SQUID | Digital SQUID |
|---|---|---|
| Dynamic Range | 10$^4$–10$^5$ Limited by feedback electronics | Unlimited |
| Slew Rate | 10$^6$ $\Phi_0$/s Limited by feedback electronics | $\Phi_0 \times f_c/N$ = 10$^4$–10$^7$ $\Phi_0$/s $f_c$ = clock freq., N = turns ratio |
| Sensitivity | 10$^{-5}$–10$^{-6}$ $\Phi_0$/$\sqrt{Hz}$ | 10$^{-5}$–10$^{-6}$ $\Phi_0$/$\sqrt{Hz}$ |
| Resolution | Not applicable | $\Phi_0$/$\sqrt{\alpha}$ $\alpha$ = Oversampling ratio |
| Room temperature electronics | Complex and expensive | Simple and inexpensive |
| Programmability | No | Yes |

Subranging Digital SQUID Architecture

While the dynamic range of each digital SQUID is unlimited, the slew rate is not. Note: The dynamic range is the ratio of the maximum signal that can be measured to that of the minimum signal that can be measured. The slew rate is the time rate of change of signals.

Figure 3:
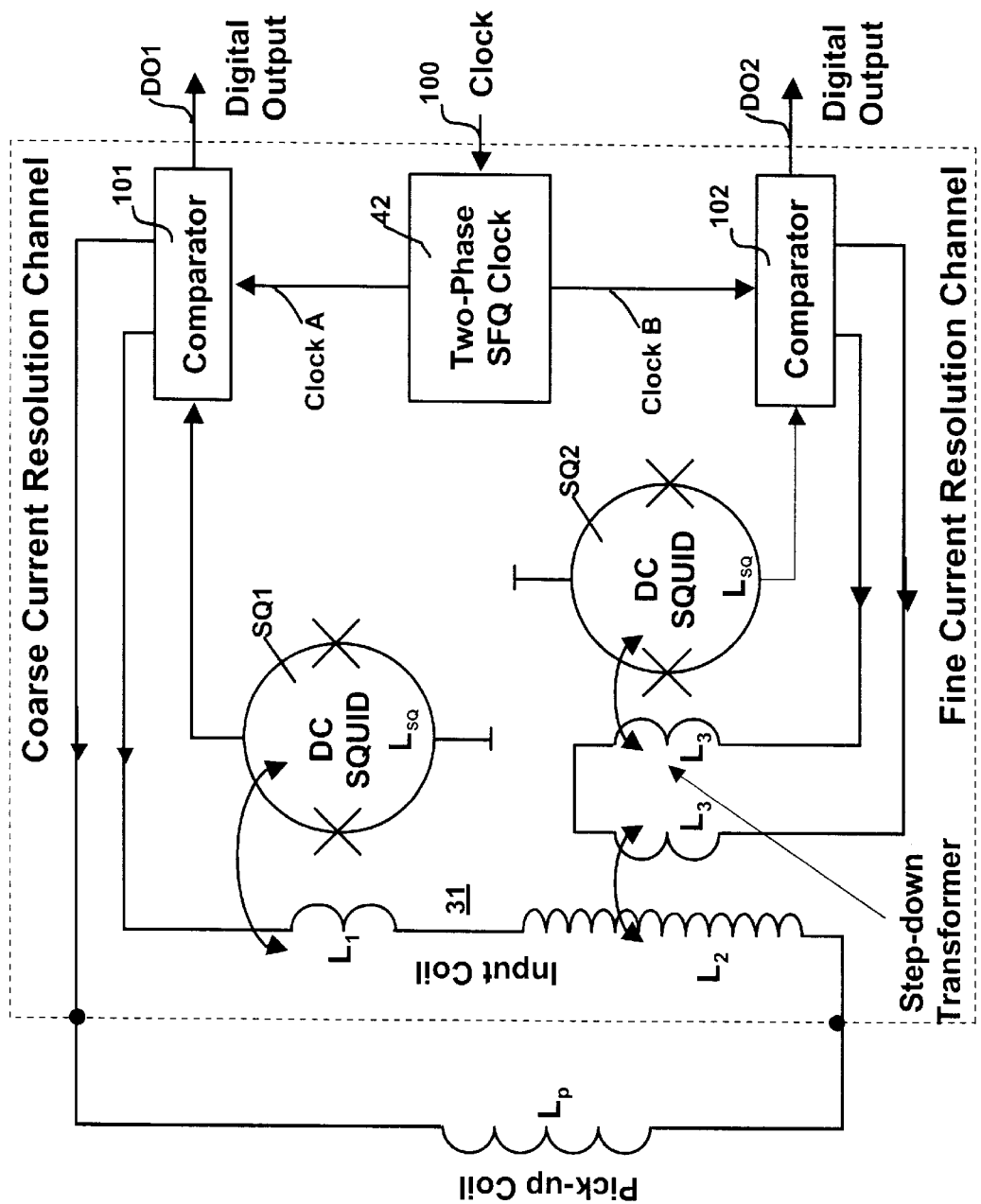
FIG. 3 is a semi-schematic semi-block diagram of a two-channel subranging circuit embodying the invention.

To reduce the slew rate limitation, a subranging architecture of the type shown in FIG. 3 and which embodies the invention is used. Referring to FIG. 3, there is shown a pick-up coil (Lp) which represents the element for sensing the current or magnetic field which is being measured. The pick-up coil (Lp) is coupled to an input coil 31 which, in this embodiment, is formed to have a first coil section (identified as L1) in series with a second coil section (identified as L2). The inductor L1 is made to have fewer turns than L2 so the inductance of L1 is less than the inductance of L2. The inductor Li is part of a "coarse" current resolution channel which is further detailed in FIGS. 4, 5 and 6. The inductor L2 is part of a "fine" current resolution channel which is further detailed in FIGS. 7, 8 and 9.

A significant aspect of the FIG. 3 embodiment is the use of the same input coil 31 to provide input to the "coarse" and "fine" SQUID based circuits and to the operation of these two SQUID based circuits from a common clock signal(s) to produce outputs which can be subsequently recombined to produce an output signal indicative of the value of the input signal sensed by the pick-up coil and coupled to the input coil 31.

The subranging circuit of FIG. 3 includes two SQUIDs (SQ1, SQ2), coupled to the same input coil 31. SQUID SQ1 is coupled at its input to inductor L1 and is magnetically coupled at its output to a comparator 101. SQUID SQ2 is coupled at its input (via a step down transformer L3) to inductor L2 and is magnetically coupled at its output to a comparator 102. Comparators 101 and 102 are also SQUIDs (see detailed structure shown in FIGS. 5 and 8). Comparators 101 and 102 are clocked (clock A, clock B) and the outputs of the comparators are fed back to the input coil 31. The interconnection of SQUID SQ1 and comparator 101 defines the "coarse" resolution channel. The interconnection of SQUID SQ2 and comparator 102 defines the "fine" resolution channel. The coarse resolution SQUID, SQ1, measures the current in larger steps leaving a smaller current, less than its step size (resolution), to be measured by the fine resolution SQUID with smaller steps. In the circuit of FIG. 3, the two coarse and fine channels may be alternately clocked; i.e., first one and then the other. Alternatively, the coarse channel can first be clocked consecutively and repeatedly until the steps are less than the "coarse" resolution. Then, the fine channel can be clocked until the steps are less than the "fine" resolution. The digital outputs (DO1, DO2) from the two SQUIDs can then be combined off chip or on chip (See FIG. 13).

The input SQUIDs SQ1 and SQ2 are analog SQUIDs which are often referred to as DC SQUIDs in the literature. These SQUIDs are current-biased ($I_{bias} > I_c$) above their critical current, in their voltage state. The analog SQUID produces a voltage that is a function of the flux applied to it. By connecting the output of each input SQUID to a series resistor and a transformer (see R5, T102 in FIGS. 5 and R5, T102b in FIG. 8) a magnetic flux proportional to the SQUID voltage is applied to its associated and corresponding comparator SQUID. Note that the flux input to the analog input SQUID (SQ1 and SQ2) is applied through a transformer, consisting of a secondary coil, which is the inductance of the SQUID loop and a primary coil, which is part of the input circuitry, that may contain a pick-up coil and the feedback network. The flux coupled to each analog input SQUID (SQ1, SQ2) is the sum of the input flux and the feedback flux signals and always kept below $\Phi_0$ for optimum operation.

Figure 18:
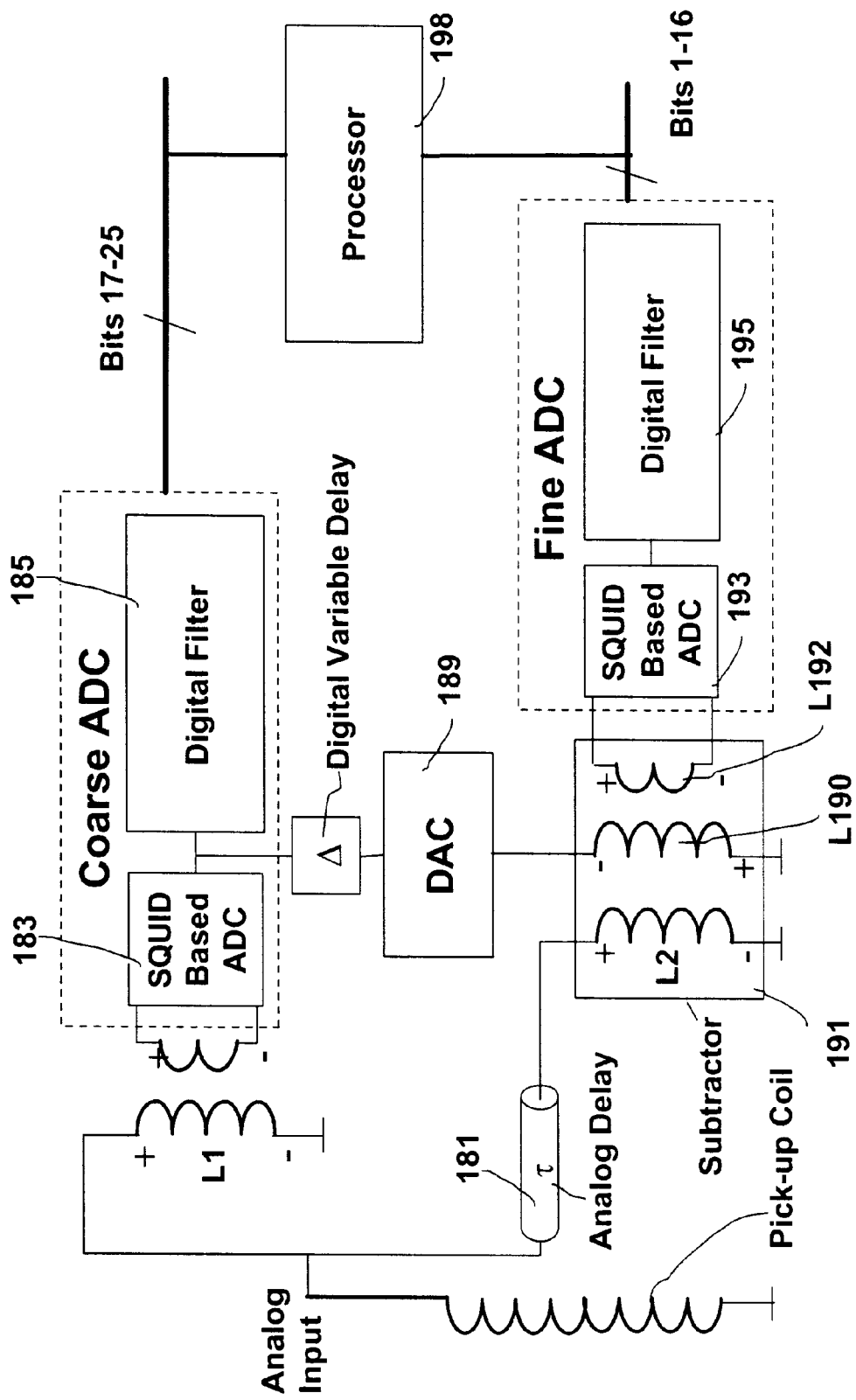
FIG. 18 is a block diagram of a subranging analog-to-digital converter (ADC) in accordance with the invention.

In FIG. 3, the input coil 31 is split into two parts, L1 and L2 connected in series. The top SQUID, SQ1, is coupled to L1, to provide the coarse resolution while the bottom SQUID, SQ2, is coupled to a step-down transformer, L3, which is coupled to L2 to provide fine resolution. The coarse resolution SQUID measures the current in larger steps leaving a smaller current, less than its step size (resolution), to be measured by the fine resolution SQUID with smaller steps. It should be appreciated, as shown in FIG. 18, that the input coil 31 can be split into two separate parallel sections (i.e., non-series connection) with each section providing a different degree of resolution.

In one embodiment of the circuit of FIG. 3, $L_1$ was made 500 pH and $L_2$ was made 1 μH. The input of coarse SQUID, SQ1, is coupled to $L_1$ which is the smaller (lower inductance) part of the input coil. The digital feedback from comparator 101 is injected directly into the input coil, tending to keep the flux in the input coil always below $\Phi_0$. The current resolution of the coarse SQUID is $\Delta I_{coarse} = \Phi_0/L_1$. This allows the measurement of large currents using the coarse digital SQUID. The fine resolution SQUID, SQ2, which may be like SQ1, is coupled to the larger part (higher inductance) of the input coil, $L_2$, through the step down transformer, L3. The digital feedback from the fine resolution SQUID, SQ2, obtained from comparator 102 is injected into the step-down transformer coil, L3. The step-down transformer coil L3 provides good signal coupling while also providing an intermediate transformation between the small inductance $L_{SQ}$ of SQ2 and the much larger inductance of L2.

The step down transformer consists of a "washer" and a "coil" in series, where the term "washer" is as used in the art and refers to the shape of an almost ideal coupling element formed above or below a coil. The washer couples to $L_2$, and the coil couples to the fine resolution SQUID, SQ2. The washer and the coil were designed to have the same inductance $L_3$. This makes the design of this transformer challenging. In one embodiment, $L_3$ was designed to be 500 pH. The resolution of the "fine" SQUID is $\Delta I_{fine} = \Phi_0/L_2$.

Assuming the inductor values to be $L_1 = 500$ pH, $L_2 = 1$ μH, $L_3 = 500$ pH, and $L_{SQUID} = 20$ pH, calculations yield the coarse resolution to be $\Delta I_{coarse} = \Phi_0/L_1 = 4$ μA and the fine resolution to be, $\Delta I_{fine} = \Phi_0/L_2 = 2$ nA. The actual fine resolution may be more than 2 nA due to coupling losses. These raw resolution numbers can be improved by averaging (integrating) by a factor of $\sqrt{\alpha}$, where $\alpha$ is the over sampling ratio (OSR).

This type of subranging measurement architecture is useful in measuring gap currents for a Beam-in-Gap (BIG) monitor in a Spallation Neutron Source (SNS), which are $10^5$-$10^6$ times smaller than the bunch current.

Figure 3A:
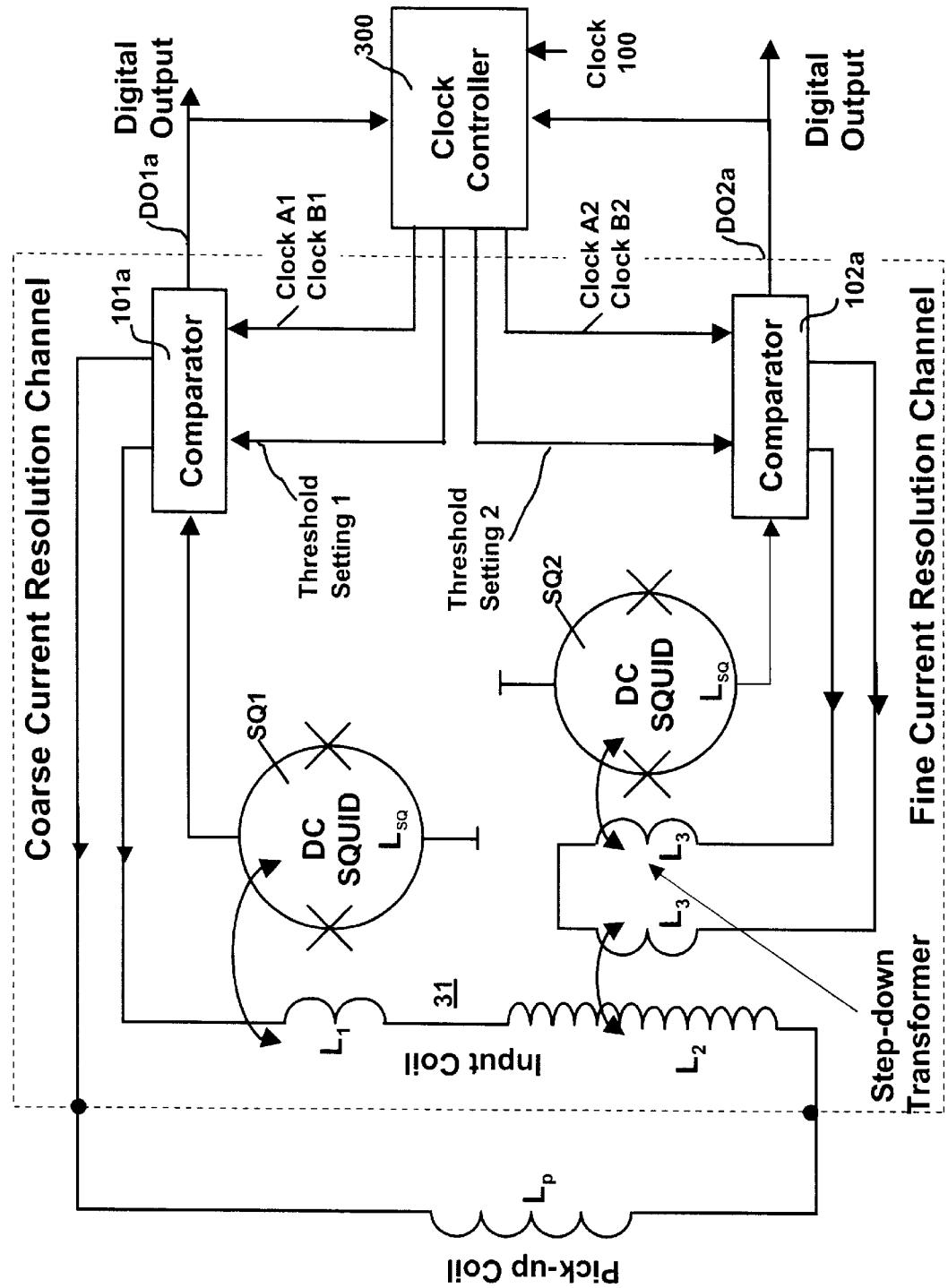
FIG. 3A is a semi-schematic semi-block diagram of another two-channel subranging circuit embodying the invention.

In one embodiment of the invention the coarse resolution SQUID, SQ1, is first used to cancel the flux in the pick-up loop until the amplitude of the input signal is below a "coarse" resolution step. Then, the fine resolution SQUID, SQ2, takes over when the flux in the pick-up loop is smaller than the resolution of the coarse SQUID. In FIG. 3, the "coarse" and "fine" channel comparators are clocked by two clock pulses (clock A and clock B) that are 180 degrees out of phase. That is, comparator 101, which is used for the "coarse" channel, is clocked by a clock signal, Clock A, and comparator 102, which is used for the "fine" channel, is clocked by a clock signal, Clock B; where clock A and clock B are 180 degrees out of phase relative to each other, but are both in synchronism with the clock signal 100 applied to the two-phase SFQ clock generating circuit 42. The advantage of using a two-phase clock is that only one of the two channels is read out for each clock pulse. The fine resolution SQUID never has to track large changes of input flux (or current). The maximum current it has to measure is $\Delta I_{coarse}$. The time resolution of the measurement is the clock period. Therefore, changes in the input current occurring between successive clock pulses cannot be measured. Note that the clocking circuit may be modified as shown in FIG. 3A, which includes clock controller 300, which may be programmed to: a) repeatedly and consecutively clock the comparator of the coarse channel and then the comparator of the coarse channel; or b) clock the two channels alternatively.

Thus, circuits embodying the invention include digital SQUIDs (SQ1 and its comparator, SQ2 and its comparator) with two different current resolutions coupled to a common pick-up coil. These types of digital SQUID circuits provide a wide dynamic range and high resolution, enabling the manufacture of versatile digital SQUID measuring instruments. Circuits embodying the invention demonstrate the feasibility of a subranging digital SQUID. The subranging architecture includes a coarse resolution channel and a fine resolution channel using a wide dynamic range and high-resolution digital SQUID. The coarse and the fine resolution channels may be designed to function independently.

A challenging aspect of this design is to construct different coil-washer combinations to obtain proper transformer turns ratios, on the same chip. By way of example, a challenging part of the design is to make a washer and a coil of the same value, $L_3$, in the fine resolution channel. As shown in FIGS. 3 and 7-9, the $L_3$ washer is coupled to a large coil $L_2$, while the $L_3$ coil is coupled to a small SQUID inductor $L_{SQ}$. In one embodiment the values of inductance were selected to be 400 pH, 1 $\mu$H, 1 nH, and 20 pH for $L_1$, $L_2$, $L_3$, and $L_{SQ}$ respectively, where $L_{SQ}$ is the inductance of SQ2. These values may be changed to accommodate different design requirements. For example, in one embodiment, since the coil-washer designs are very time consuming, the inductance values were chosen such that the same transformer design could be used for both coarse and fine channels. In a particular embodiment the value of both $L_1$ and $L_3$ were chosen to be 500 pH. The values of $L_2$ and $L_{SQ}$ were kept at 1 $\mu$H and 20 pH respectively. Further details of the coarse and fine current resolution channels are discussed below.

Figure 4:
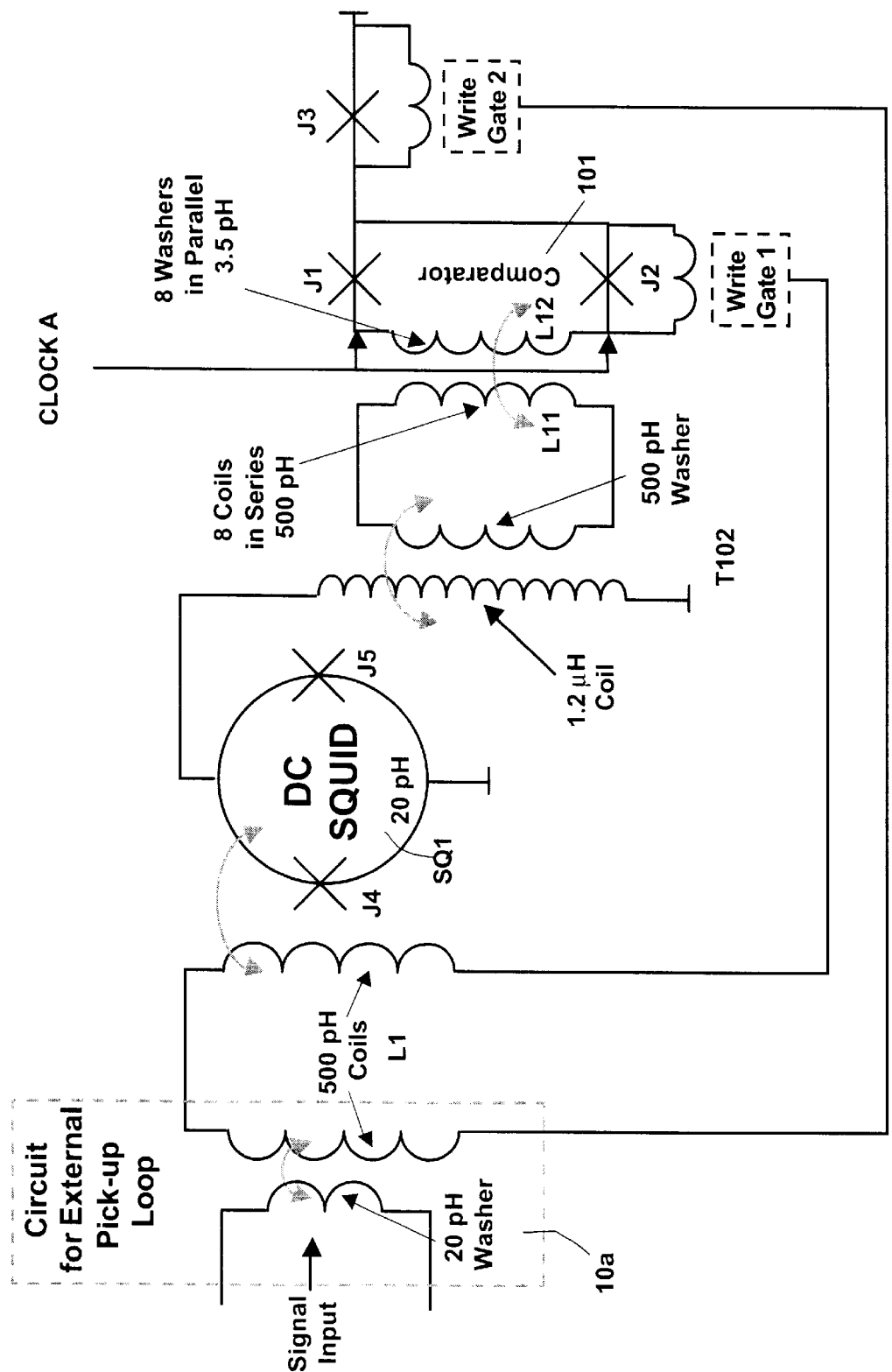
FIG. 4 is a schematic diagram of a "coarse" resolution channel useable in the circuit of FIG. 3 showing the various transformer configurations.
Figure 5:
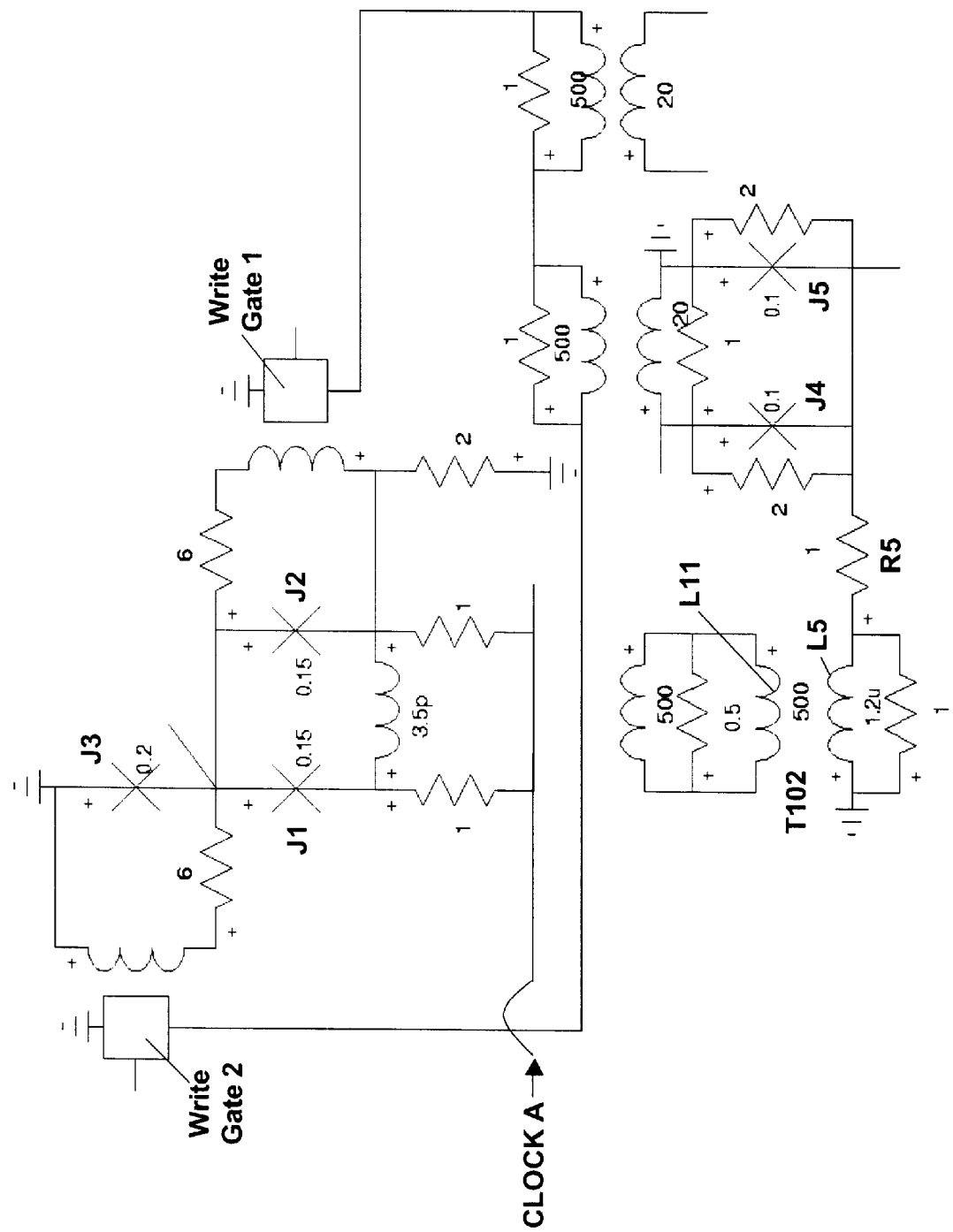
FIG. 5 is an equivalent circuit (the WRSpice model) of the "coarse" channel circuit of FIG. 4.
Figure 6:
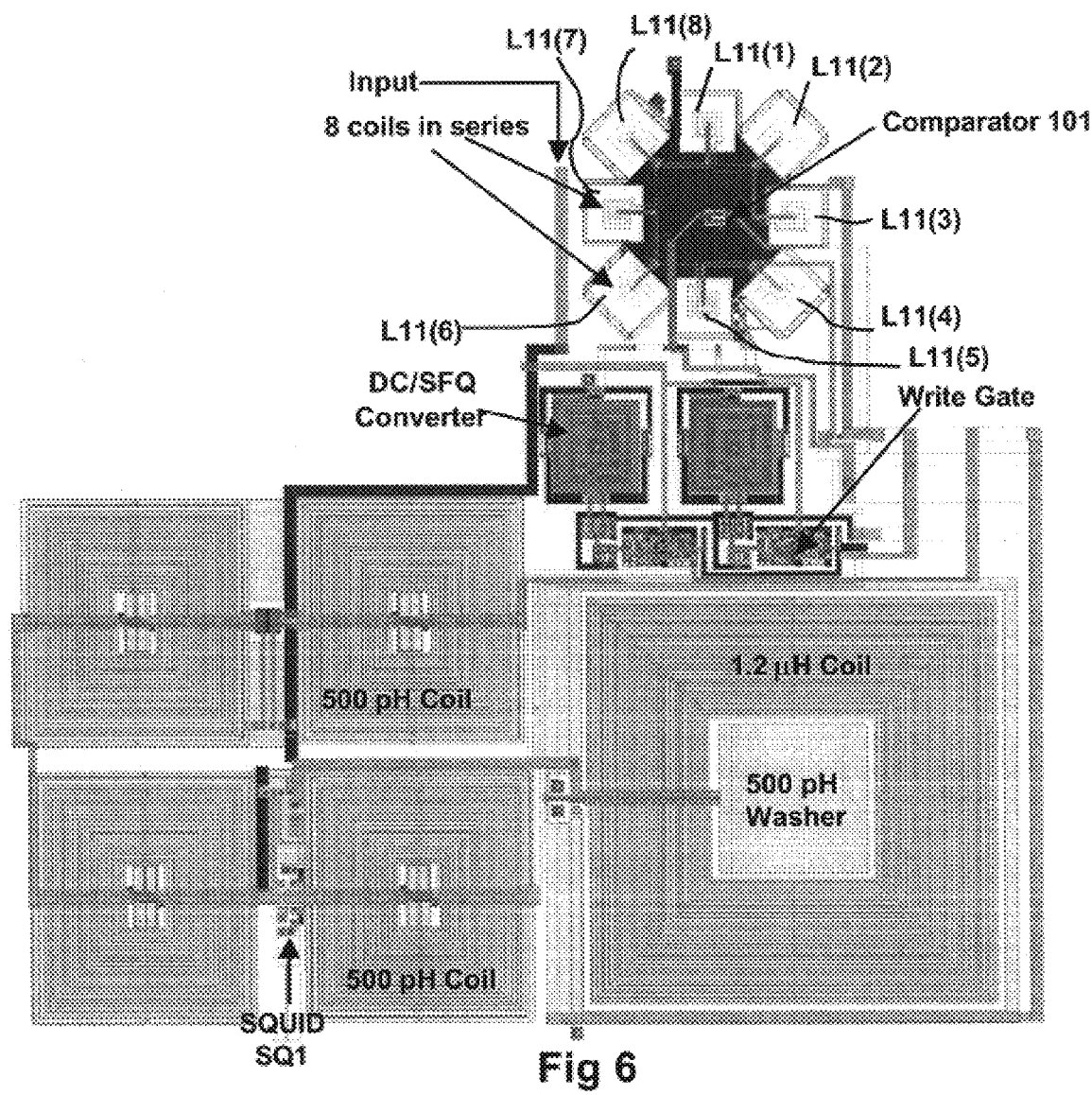
FIG. 6 is a top view of a layout showing some components of the coarse resolution channel.

FIG. 4 is a simplified schematic of the coarse resolution digital SQUID. The coarse resolution channel has an input inductor L1 (shown in FIG. 4 to have a value of 500 pH) coupled to SQUID SQ1. The output of SQ1 is coupled through a step-down transformer T102 to comparator 101. In response to an externally applied clock identified as Clock A in FIG. 3, the comparator 101 feeds back flux quantum, $\pm\Phi_0$, through the write gates (write gate 1 or 2 in FIG. 4) into the input coil, L1. In practice, this feedback loop (a superconducting path) is completed with an external pick-up loop, 10a. In a test set up the pick-up loop was replaced with a step up transformer—a 20 pH washer coupled to a 500 pH coil. The design of this transformer may be identical to the input coil L1 coupled to SQ1. The electrical schematic and layout of the FIG. 4 circuit are shown in FIG. 5 and FIG. 6, respectively. In FIG. 5, the units of junction critical currents, resistances, and inductances are in mA, ohms, and pH unless indicated otherwise.

The output from SQ1 is coupled to comparator, 101 by coupling a transformer T102 to a large inductance L11 (500 pH) and by coupling L11 to a small (3.5 pH) comparator inductance L12. This was done by constructing the large inductance (L11) from 8 smaller coils, as shown in FIG. 4, connected in series as detailed in FIG. 6. Each of these 8 series inductors is coupled to one of 8 washers, which are connected in parallel.

FIG. 6 is a layout of the coarse resolution channel of the digital SQUID. There are three levels of niobium (Nb) metal (M1, M2, and M3) of the standard HYPRES Corporation fabrication process whose specifications are incorporated herein by reference). The Nb ground plane (M0 layer) is present everywhere except in specified areas. The ground plane holes enhance coupling in transformers.

Figure 7:
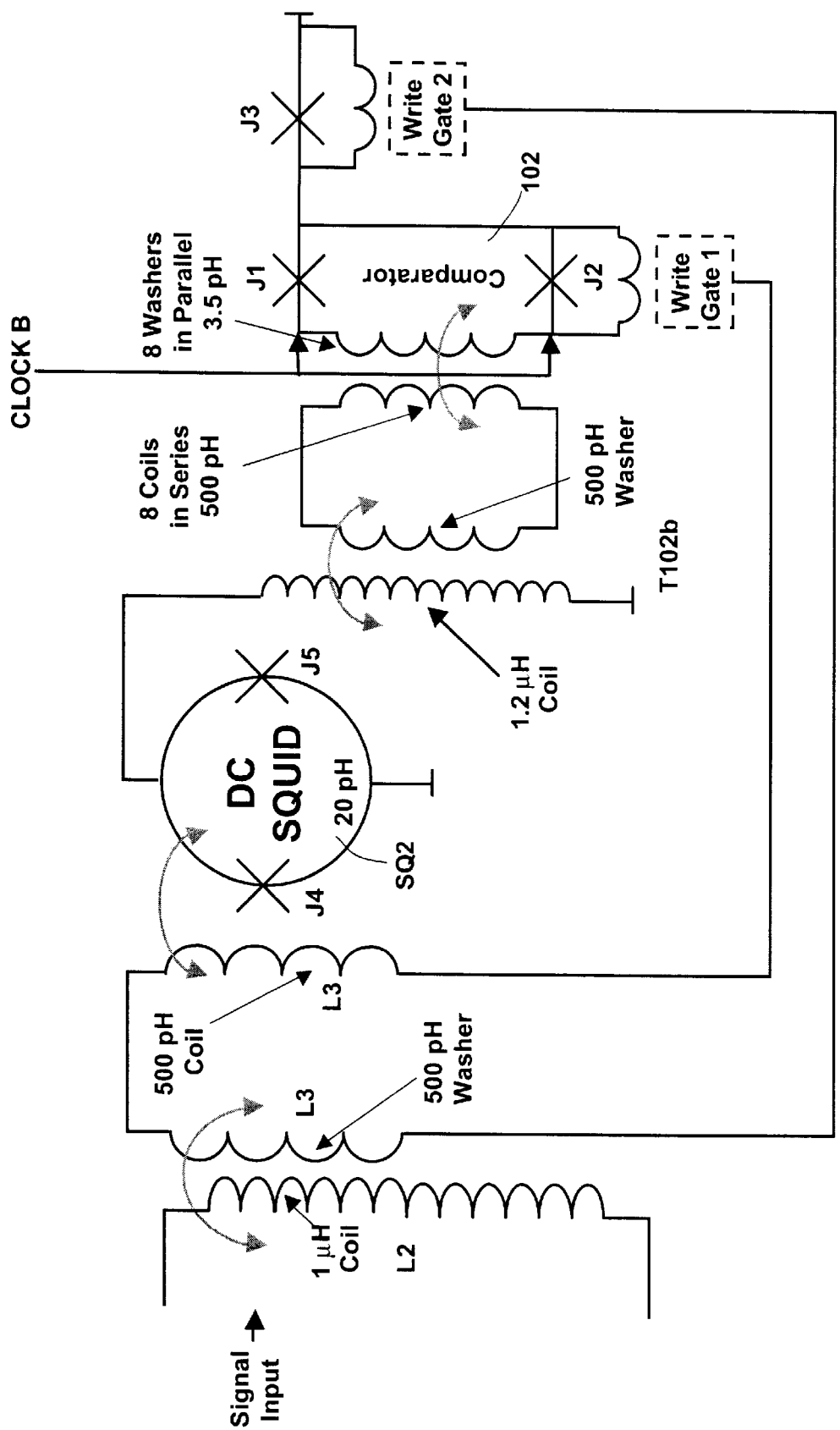
FIG. 7 is a schematic diagram of a fine resolution channel useable in the circuit of FIG. 3 (or FIG. 3A) showing various transformer configurations.

FIG. 7 is a simplified schematic of the fine resolution digital SQUID. The fine resolution channel has an input inductor ($L_2$=1 $\mu$H) coupled to the input of SQUID, SQ2, through a coupling/feedback step down transformer (L2-L3). The coupling/feedback step down transformer consists of a 500-pH washer, coupled to $L_2$ and a 500-pH coil, coupled to the SQUID, SQ2. The output of SQUID, SQ2, is coupled to comparator 102 via a step down transformer T102b. The comparator 102 feeds back $\pm\Phi_0$ through write gates 1 and 2 into the feedback transformer (L3). The rest of the fine resolution circuit is similar to the coarse resolution channel circuitry. In one embodiment, the current resolution of the fine channel was $\Delta I_{fine}=\Phi_0/L_2=2$ nA.

Figure 8:
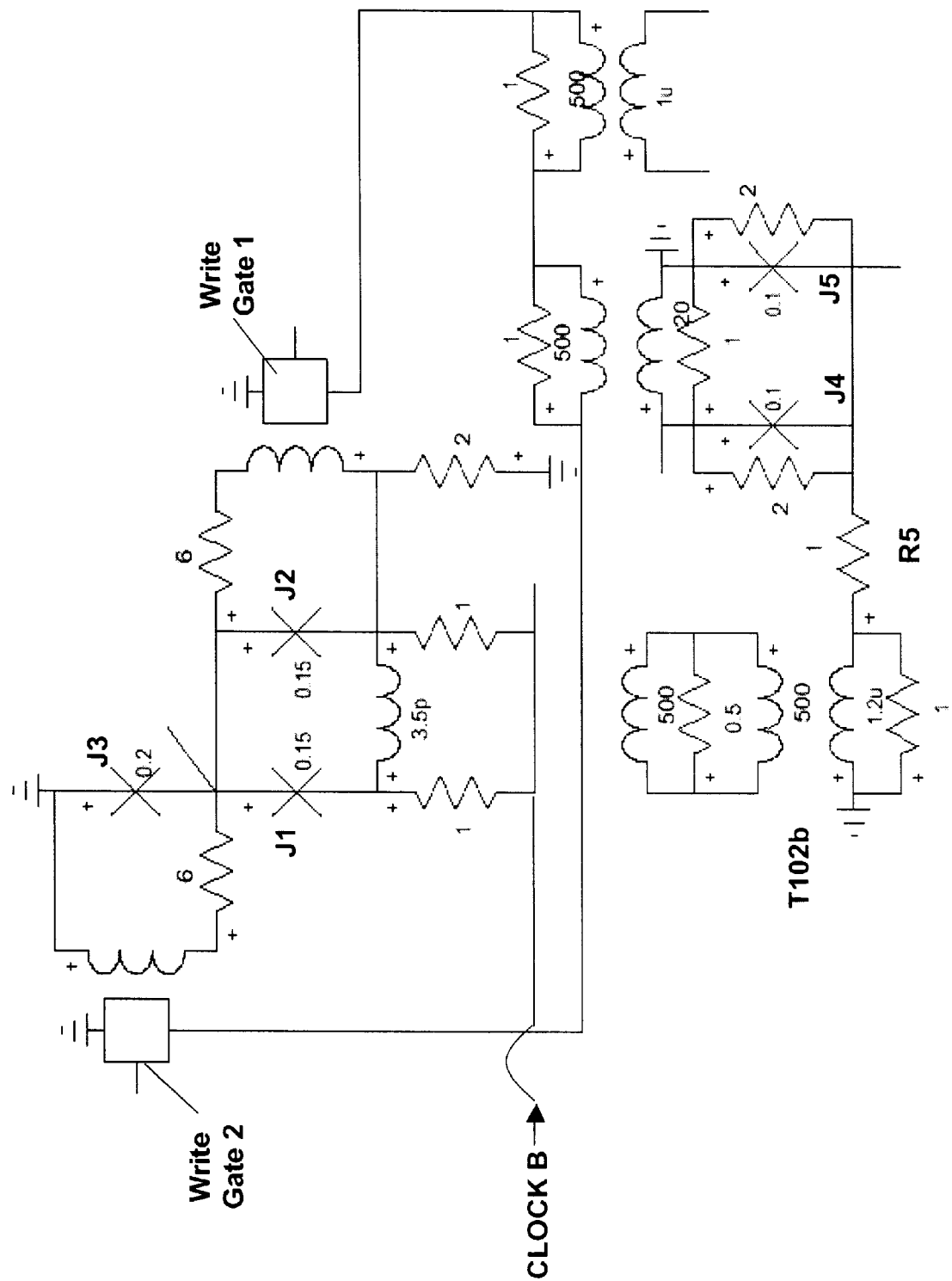
FIG. 8 is an equivalent circuit (the WRSpice model) of the fine resolution channel of FIG. 7.
Figure 9:
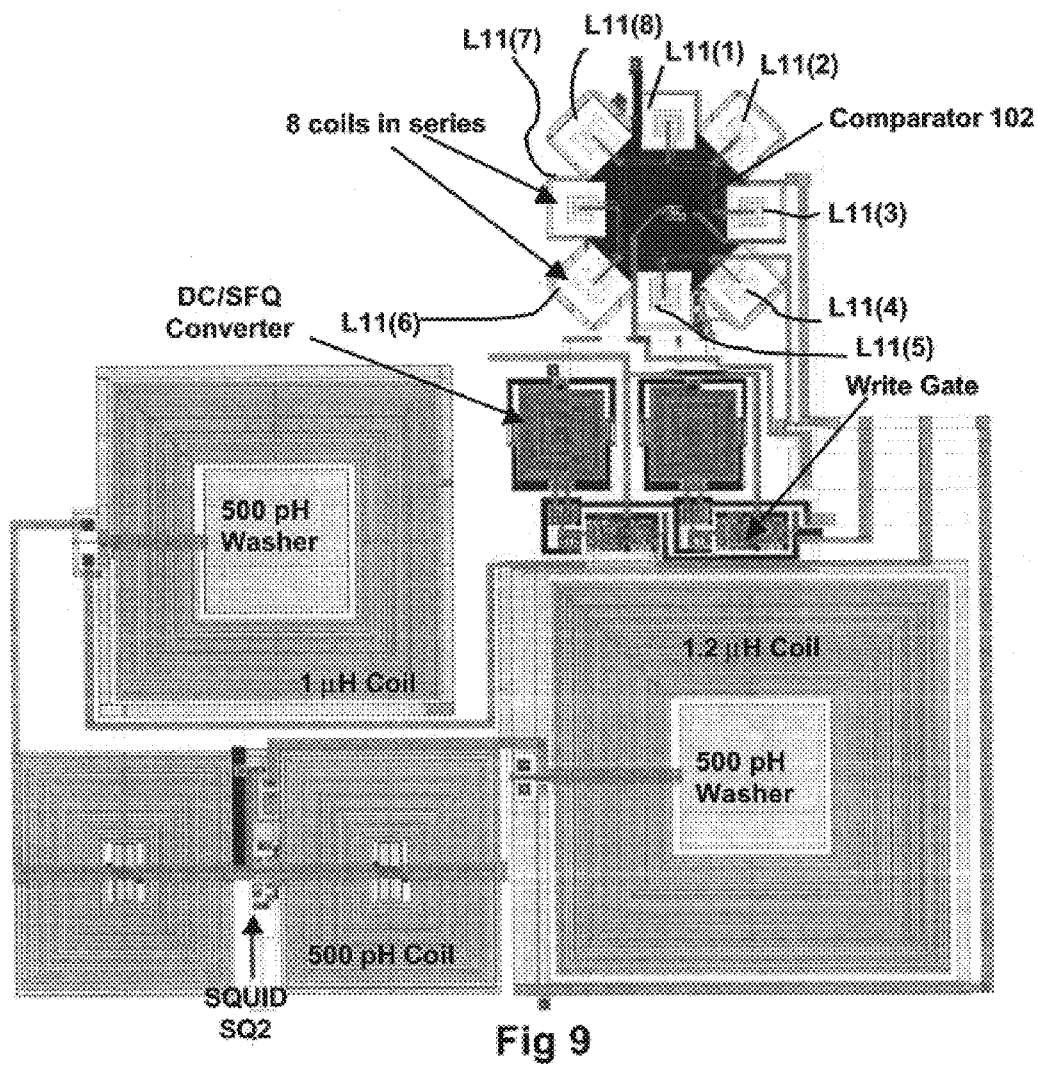
FIG. 9 is a top view of a layout showing some of the components of the fine resolution channel.

In FIGS. 7 and 8, the units of junction critical currents, resistances, and inductances are in mA, $\Omega$, and pH, unless indicated otherwise.

In the circuits shown in FIGS. 3, 4-6 and 7-9, a single clock (the input clock 100, clock A, clock B) may be used for the comparator and the write gates. So operated the circuits exhibit extremely wide dynamic range and reasonably low noise. This is an improvement over an earlier version that used two separate clocks for the comparator and the write gates. However, either a single clock or a two-phase clock may be used to practice the invention. Although the comparator shown in the figures has a particular form, other suitable comparators may be used.

FIG. 3A shows "coarse" and "fine" current resolution channels similar to the ones shown in FIG. 3. However, the circuit of FIG. 3A includes additional controls applied via a clock controller 300 to comparators 101a, 102a. One set of controls are used to control the application of the clocks to the comparators already noted above and as further discussed below. Furthermore, the clock controller 300 includes circuitry controlling the application of a clock signal (clock A1, B1, A2 or B2) to the comparators. In one mode of operation, the clock controller senses the presence of signals (e.g., pulses) at the outputs DO1a, DO2a, of the comparators and supplies clock signals for controlling the sampling by the comparators.

Another set of control signals includes threshold settings 1 and 2 which are used to bias the threshold (flux bias) levels of comparators 102a, 102a. The flux bias may be used to set the switching of the respective comparators either around a zero threshold or a non-zero threshold. The comparators include write gates (e.g., see FIG. 4A) with independent biases (e.g., current biases I11 and 12). The independent write gate biases control the threshold levels for the production of pulses at the outputs DO1a, DO2a of the comparators, which pulses are used for output and feedback.

Referring to FIG. 4A, which is a more detailed view of a comparator useable in circuits embodying the invention, note that the current biases (I1, I2) of the two write gates (WG1 and WG2) of a comparator, control the injection of fluxons into the input loop in either direction. Instead of using a common bias that makes the two thresholds equal, by changing these biases independently, the two (higher and lower) thresholds can be controlled independently. The flux bias introduces an additional constant flux in the loop which sets the threshold for switching J2 or J3 when the clock pulse is applied. If flux bias is zero, J2 and J3 switch when the input flux is greater than or less than zero. Otherwise, they switch when the input flux is greater than or less than the added bias flux.

Using different bias level for setting different threshold levels, a comparator circuit of the type shown in FIG. 4A, in response to a clock pulse, produces either (1) a feedback of $-\Phi_0$, by switching "write gate 2" and a 2-bit binary output (01 or 10) if the input flux coupled from the DC SQUID is less than a lower threshold $\Phi_L$).

(2) a feedback of $+\Phi_0$, by switching "write gate 1" and complementary binary outputs (10 or 01) if the input flux is more than a higher threshold ($\Phi_H$).

(3) no feedback is produced if the applied flux is $\Phi_L<\Phi<\Phi_H$ and no output is produced (0 0).

The comparator output of FIG. 4A may have three possible values. Assigning binary values to the outputs on lines X and Y, the binary output may be 01, 10 or 00. This 2-bit digital code may be converted to a differential code ('01'=−1, '00'=0, '10'=+1) by a gate and applied to a bi-directional (up-down) counter.

Often the threshold levels are chosen to be symmetric around 0 ($\Phi_L=-\Phi_H$) and sometimes are both equal to zero. In the case where the two thresholds are equal, $\Phi_L=\Phi_H$, the comparator output can then only be one of two values and can be described as a circuit that in response to a clock pulse produces either (1) a feedback of −$\Phi_0$, by switching "write gate 2" and binary output (1 or 0) if the input flux is less than a threshold (2) a feedback of +$\Phi_0$, by switching "write gate 1" and complementary binary output (0 or 1) if the input flux is more than a threshold.

Clocking Scheme

For optimum operation, a controlled clocking scheme of a multi-channel subranging digital SQUID based ADC is desirable. First of all, the clocks for each channel may be derived from a common master clock. For example, a two-channel device may be clocked using alternate clock phases generated from a two-phase clock source. In addition, a clock controller (e.g., 300 in FIG. 3A) may be used to apply a set of one or more clock pulses to each channel following an algorithm to ensure correct operation.

For example, assume a two-channel device with a coarse channel with signal resolution $LSB_{coarse}$ and a fine channel with signal resolution $LSB_{fine}$, where LSB is the least significant bit or the smallest signal that can be resolved. The comparator (e.g., 101, 102, 101a, 102a) is a circuit that in response to a clock pulse produces either (1) a feedback of −$\Phi_0$, by switching "write gate 2" and binary outputs (1, 0) if the input flux is less than a lower threshold ($\Phi_L$)

(2) a feedback of +$\Phi_0$, by switching "write gate 1" and complementary binary outputs (0, 1) if the input flux is more than a higher threshold ($\Phi_H$).

(3) no feedback is produced if the applied flux is $\Phi_L<\Phi<\Phi_H$ and no output is produced (0, 0).

These outputs may be generated in complementary fashion and are in the form of SFQ pulses. Often the threshold levels are chosen to be symmetric around 0 ($\Phi_L=-\Phi_H$) and sometimes are both equal to zero. One clock controlling algorithm is as follows:

Step 1: Set the thresholds of the coarse and the fine channel comparators

Step 2: Apply a set of consecutive clock pulses to the coarse comparator until the applied flux is between the two thresholds and does not produce any feedback.

Step 3: Apply a set of consecutive clock pulses to the fine comparator until the applied flux is between the two thresholds and does not produce any feedback.

Step 4: Repeat Steps 2 and 3.

Definition of Sensitivity and Resolution: Sensitivity of a measuring device is the smallest signal that can be detected in the presence of noise. SQUIDs are very sensitive measurement devices for magnetic flux. Resolution is a property of a digital device and refers to the smallest discrete level. This is also referred to as the least significant bit (LSB). The fundamental flux resolution of a SQUID-based device is a single flux quantum (F0), but the resolution of an ADC can be improved further through digital filtering if the sampling frequency is higher than the twice the signal bandwidth (Table 1).

Figure 13:
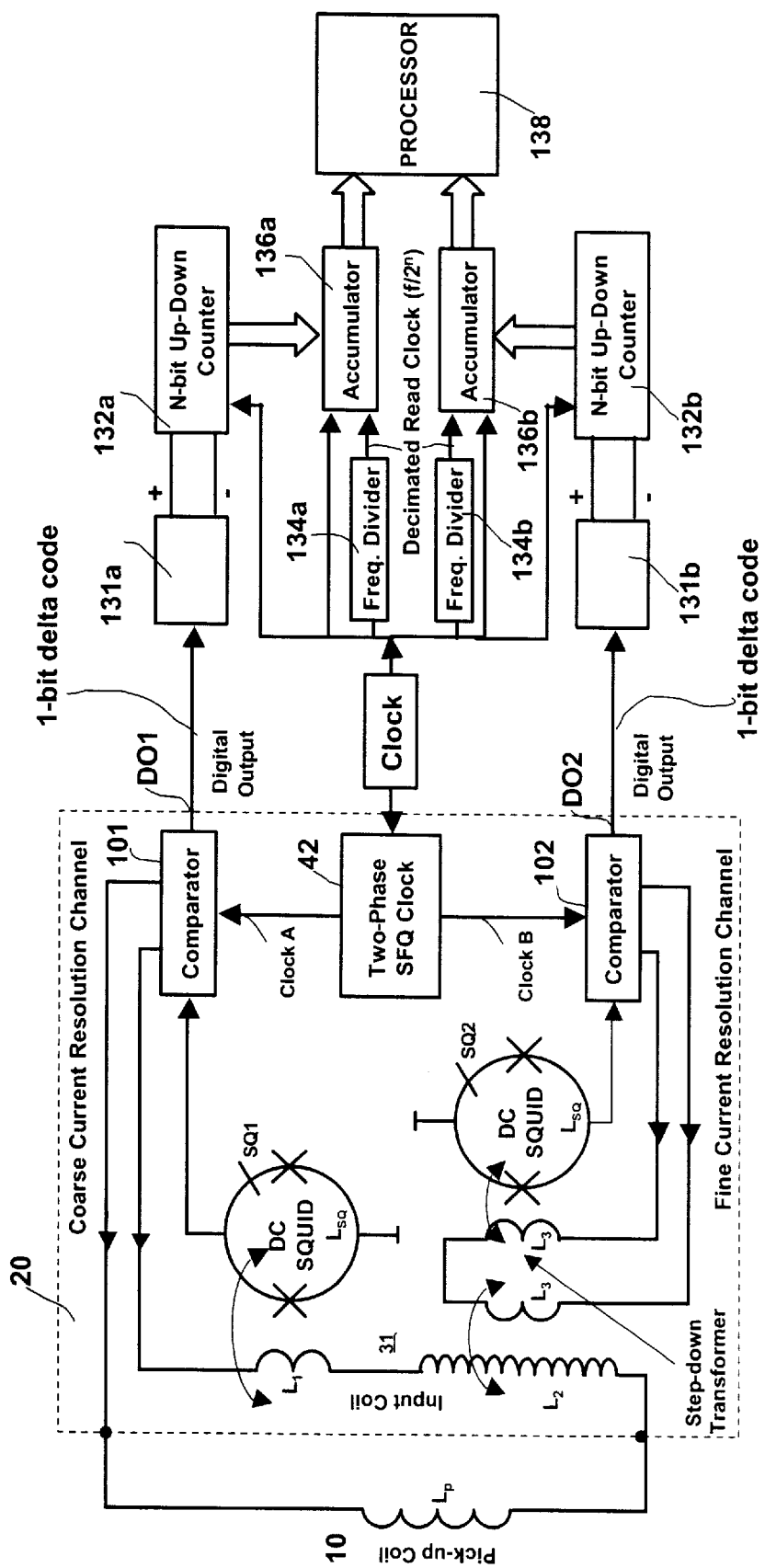
FIG. 13 is semi-schematic/semi-block block diagram of a two-channel subranging circuit embodying the invention and of circuitry for processing the outputs of the two channels.

An example of one mode of operation of the circuit of FIG. 3, or FIG. 3A, when coupled to processing circuitry 130 of the type shown in FIG. 13 is discussed below. In this example, all quantities are represented as decimal numbers. Assume that a signal of 34.3 units is applied instantaneously to the circuit of FIG. 3 or FIG. 3A. Assume that the resolution of the coarse channel is 10 units and that of the fine channel is 1. The following clocking algorithm may be used:

1) Set the "coarse" channel comparator thresholds at +9 and −9, and set the "fine" channel comparator threshold at 0.

2) Apply clock pulses to the "coarse" channel until its comparator (101, 101a) produces a zero output (when the signal is between the upper threshold of +9 and the lower threshold of −9).

3) Then, apply clock pulses to the "fine" channel until its comparator (102, 102a) output changes sign.

4) Repeat steps 2 and 3.

For the assumptions noted above, the sequence of clock events and clock cycles to which the circuit is placed is summarized in Table 2, below. Note that "Events" 10-12 will repeat indefinitely until the signal value is changed. The average accumulated output is between 34 and 35, implying that the error is less than the least significant bit of 1 in the fine channel.

Figure 10:
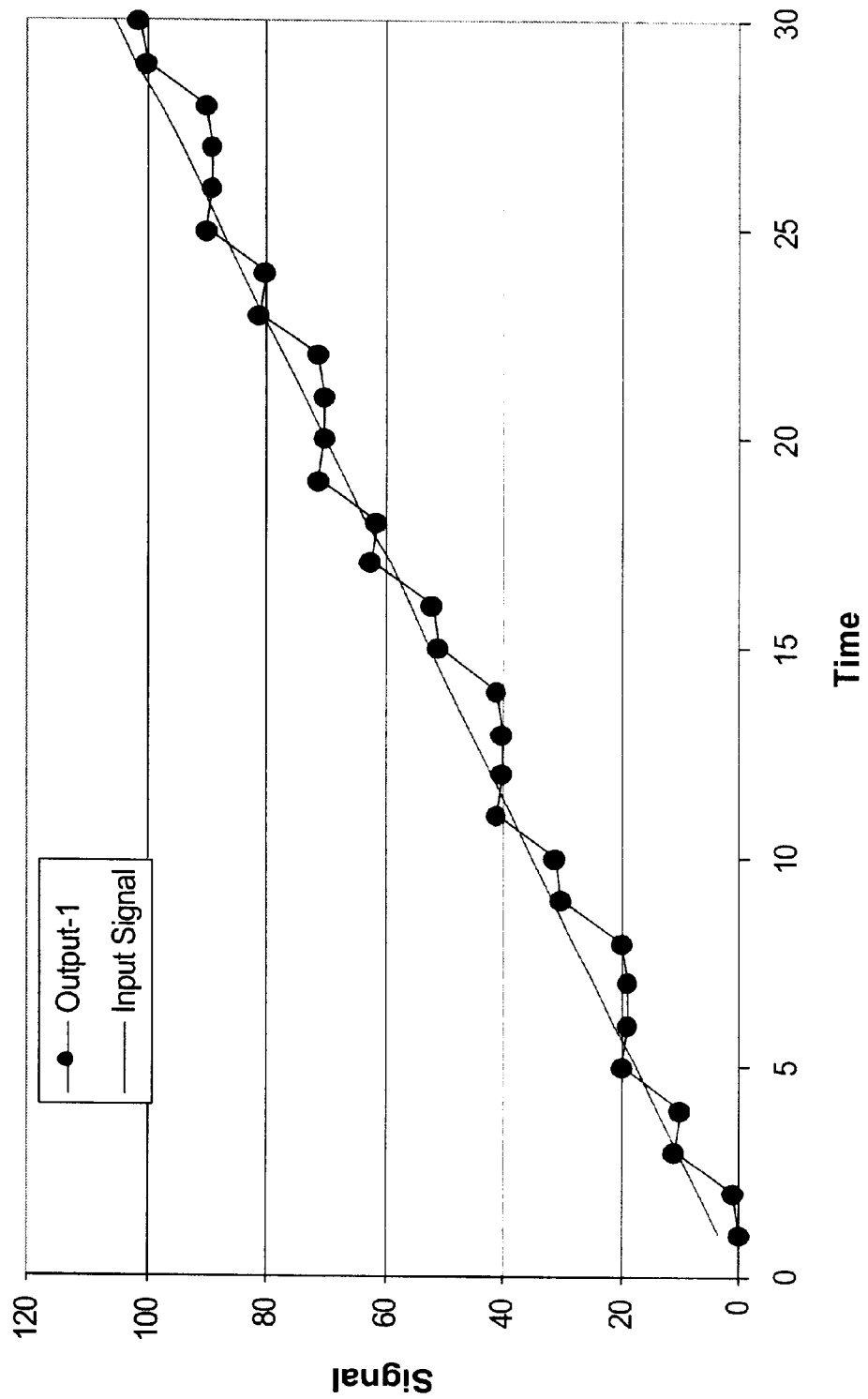
FIGS. 10 and 11 illustrate the output produced by circuits embodying the invention in response to a linearly increasing input signal.
Figure 11:
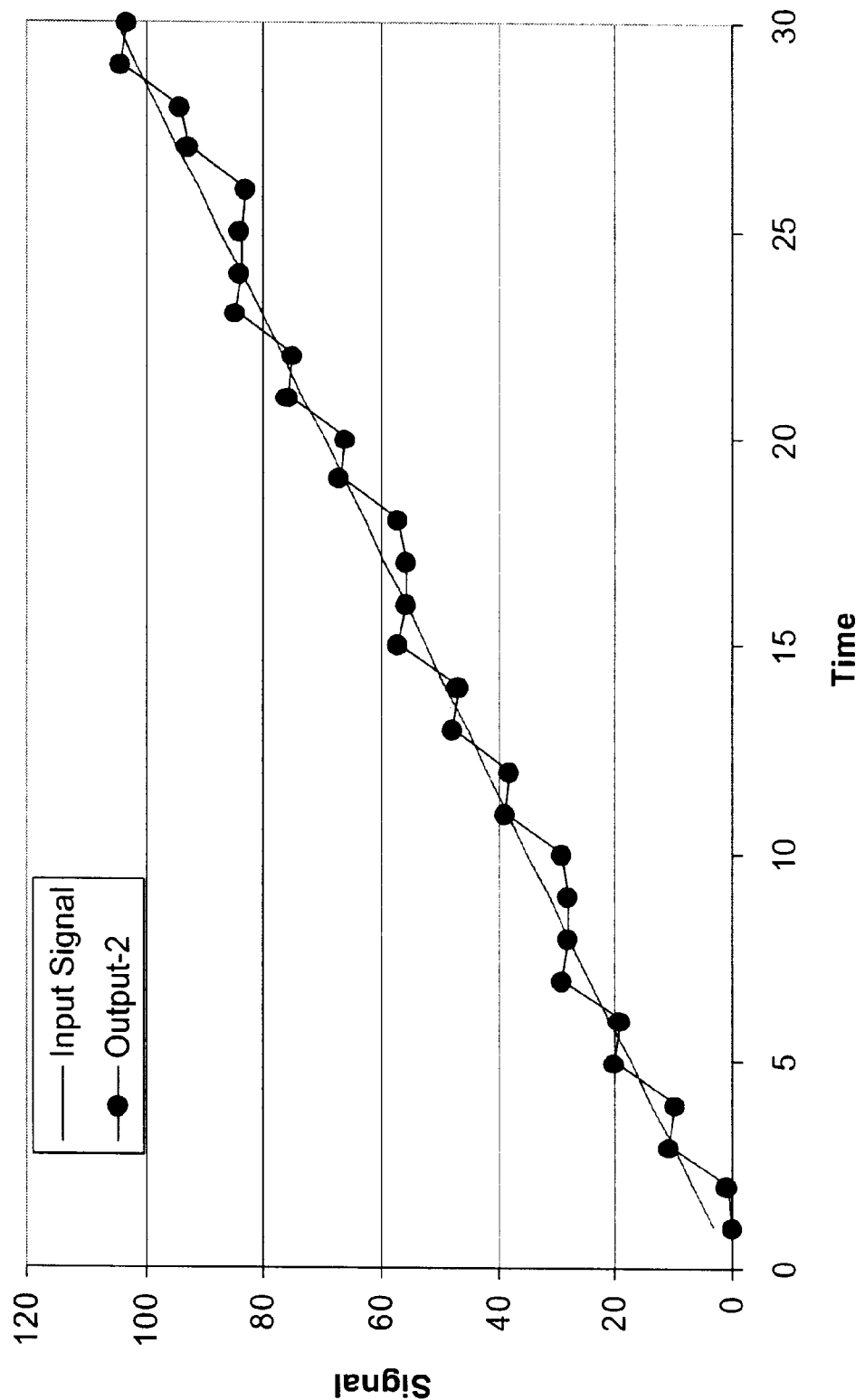

The situation is a little more complicated for the measurement of time varying input signals. Especially for fast changing signals, where most of the tracking has to be performed by the coarse channel, the clocking algorithm may have to be changed to allow for the thresholds and the clocking sequence of the coarse and the fine channels to alternate. FIGS. 5 10 and 11 show an example of the output signals for two different threshold criteria for the coarse channel (±7 in Output−1 and ±2 in Output−2) for a linearly increasing input signal. The time unit is the clock period.

TABLE 2

| Event | Clock applied to | Signal remaining in the input loop | SQUID Output | Accumulated Output (Count) |
| --- | --- | --- | --- | --- |
| 1 | Coarse comparator | 34.3 | 10 | 10 |
| 2 | Coarse comparator | 24.3 | 10 | 20 |
| 3 | Coarse comparator | 14.3 | 10 | 30 |
| 4 | Coarse comparator | 4.3 | 0 | 30 |
| 5 | Fine comparator | 4.3 | 1 | 31 |
| 6 | Fine comparator | 3.3 | 1 | 32 |
| 7 | Fine comparator | 2.3 | 1 | 33 |
| 8 | Fine comparator | 1.3 | 1 | 34 |
| 9 | Fine comparator | 0.3 | 1 | 35 |
| 10 | Fine comparator | −0.7 | −1 | 34 |
| 11 | Coarse comparator | 0.3 | 0 | 34 |
| 12 | Fine comparator | −0.3 | 1 | 35 |
| 13 | Fine comparator | −0.7 | −1 | 34 |
| 14 | Coarse comparator | 0.3 | 0 | 34 |
| 15 | Fine comparator | −0.3 | 1 | 35 |

Figure 12:
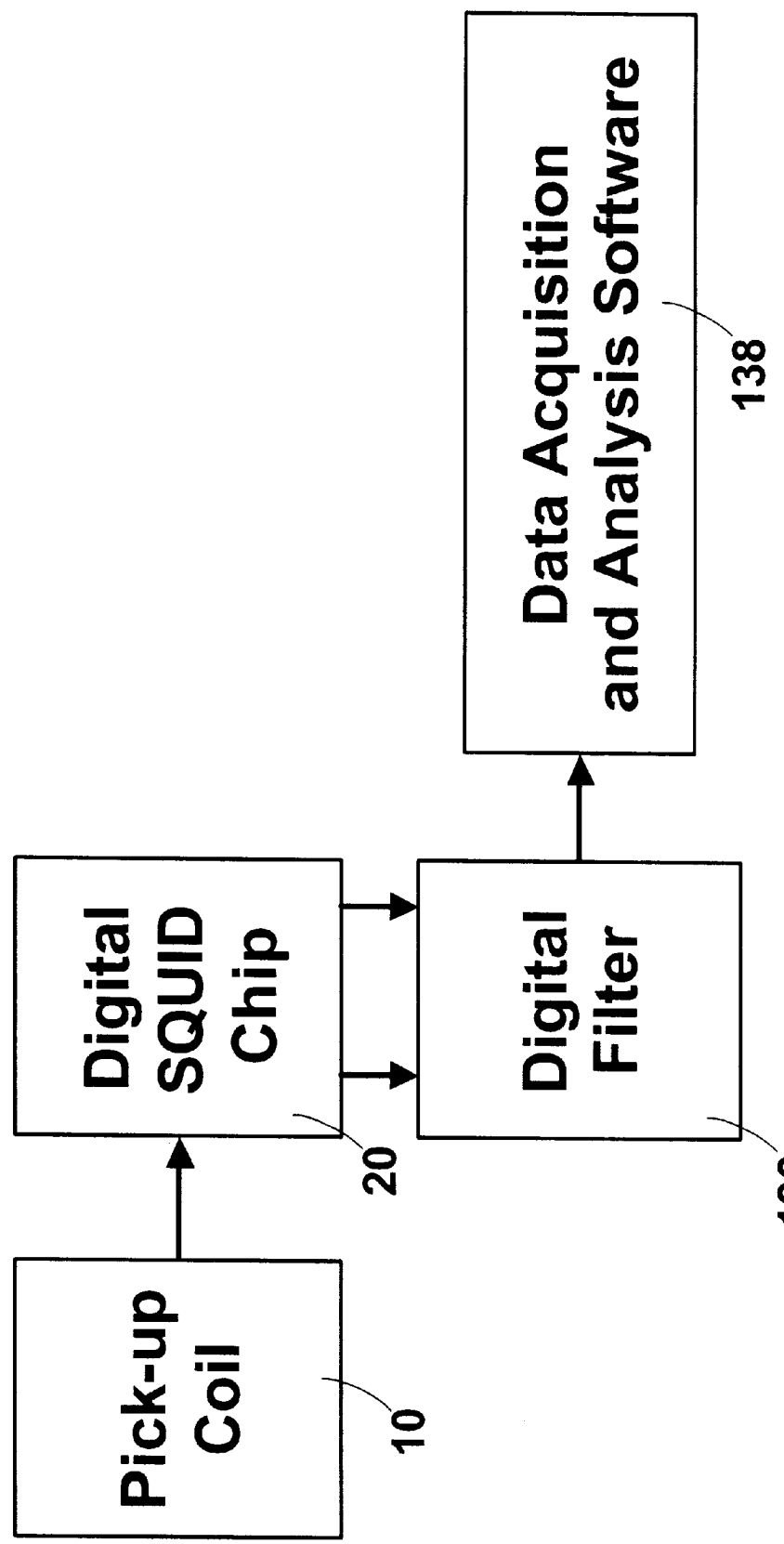
FIG. 12 is a block diagram of a modular precision current measurement instrument based on the digital SQUID technology.

FIG. 12 is a block diagram of a system employing the SQUID technology in accordance with the invention. The output of a pick-up coil 10 (or 10a) is coupled to a digital SQUID chip 20, of the type described in FIGS. 3–9 or in FIGS. 18 and 19, described below. The outputs of chip 20 are supplied to digital filter circuitry 130 whose outputs may be further processed by a data acquisition and analysis software processor 138. The resolution of the digital SQUID 20 is quantized. The raw flux and current resolutions are $\Phi_0$ (2.07 fWb) and $\Phi_0/L$, where L is the input inductance. The foregoing statement applies for a single channel digital SQUID; for a subranging digital SQUID, it applies to the channel with the highest resolution. For a 1 µH input inductance, the current resolution is about 2 nA. However, for slowly varying or dc signals the resolution can be increased by over sampling. If the clock frequency is higher than the Nyquist rate for a given signal bandwidth, the resolution can be improved further by averaging the digital SQUID output. A digital filter can be employed to perform this averaging. The resolution improves by a factor of $\sqrt{\alpha}$, where $\alpha$ is the over sampling ratio (OSR). If the input bandwidth is 100 Hz and the clock frequency is 200 MHz, the resolution can be improved by a factor of 1000 to 2 pA. On the other hand, if the input bandwidth is 1 MHz, the current resolution can be improved only by a factor of 10 to 200 pA.

One of the main advantages of the digital SQUID approach is the simplicity of the peripheral electronics, which can be easily extended for multiple channels, i.e., more than just one coarse and one fine channel may be used in the subranging scheme to process the input signal from the pick up coil. The peripheral electronics may include a digital integrator (decimation filter) and signal processing software. The digital integrator can be a counter/accumulator circuit implemented in programmable logic as shown in FIG. 13.

FIG. 13 includes a block diagram of circuitry for processing the outputs DO1 and DO2 shown in FIG. 3 (or DO1a, DO2a shown in FIG. 3A) where each digital SQUID output is a 1-bit (or a 2-bit) delta code. This code is converted via gates 131a, 131b into a differential code and applied to an up-down counter 132a, 132b. The counts are accumulated over the read cycle in an accumulator 136a, 136b. A read clock is obtained by dividing the clock frequency by $2^n$ in a frequency divider 134a, 134b. The outputs of the accumulators 136a, 136b represent the average reconstruction of the input signal applied to the digital SQUIDs.

The principle of operation of the digital SQUID circuit has been described using a 1-bit and a 2-bit delta modulator. The output of the digital SQUID comparator (101, 102) is a "1-bit delta code". The outputs of the digital SQUID comparators (101a, 102a) may be a "1-bit delta code" or a 2-bit delta code, as described above. In each clock cycle, the comparator produces a signal which may be defined as a binary "1" (e.g., when the DC SQUID senses positive flux) or a signal which may be defined as a binary "0" (e.g., when the DC SQUID senses negative flux) as its digital output. A gate (e.g., 131a, 131b), with differential output, is used to convert this digital output into a differential code at the input of the up-down counter (132a, 132b). When the digital SQUID output is "1" ("0") the gate sends a signal from its positive (negative) output to the "up" ("down") input of the counter. However, as noted above for FIGS. 3A and 4A by setting different threshold levels a 2-bit delta code may be outputted from each comparator.

Figure 14:
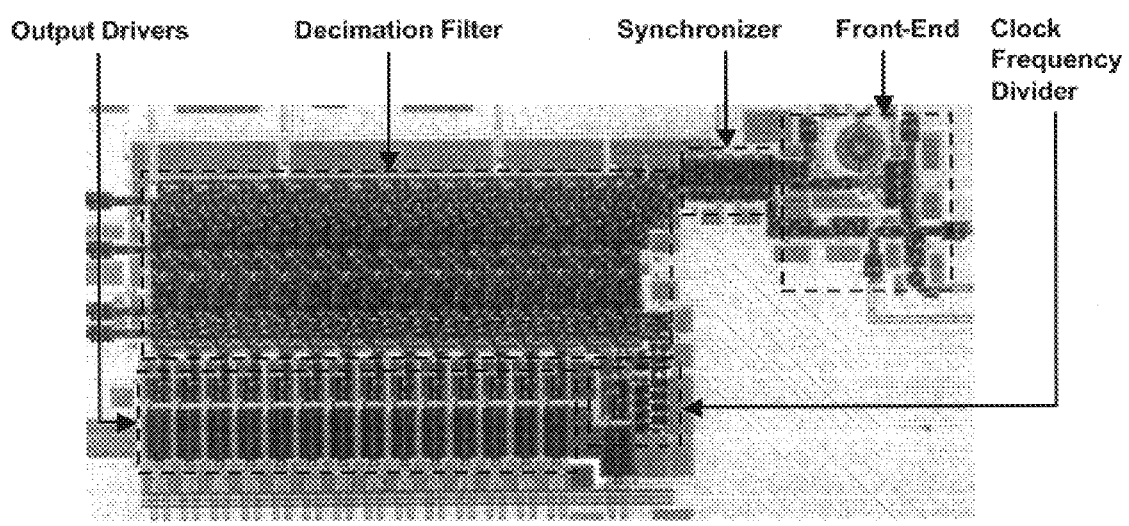
FIG. 14 is a micro-photograph of a high resolution analog-to-digital converter (ADC) circuit suitable for use with digital SQUIDs embodying the invention.

Each one of up-down counters 132a, 132b is non-destructive and should be large enough for the dynamic range of interest. The counter sends the raw reconstructed output to an accumulator 136a, 136b that is read out periodically, in response to a read clock signal. This read clock may be derived by decimating the clock by an n-bit binary frequency divider 134a, 134b. The counter/accumulator combination acts as a digital low-pass filter. A version of this digital filter was built using room-temperature field-programmable gate arrays (FPGA) with a 28-bit counter and a decimation ratio of $2^{14}$ for a clock frequency (f) of 15 MHz. A very high frequency (20-25 GHz) version of this filter was also developed using superconducting RSFQ electronics to build a high-resolution analog-to-digital converter (FIG. 14). However, the superconducting versions include complex digital circuits (several thousand JJs) and suffer from low fabrication yield. Therefore, a room temperature version may be better suited for low speed (up to 20 MHz) applications. However, either scheme may be used.

FIG. 14 is a micro-photograph of a high resolution analog-to-digital circuit suitable for use with digital SQUIDs embodying the invention; capable of producing 96 dB spur-free dynamic range (SFDR) and 14-bit signal-to-noise ratio (SNR) at 10 MSample/s. It runs with an internal 20 GHz clock and a programmable clock frequency divider. The decimation filter has been operated up to 25 GHz clock frequency. This fast, pipelined filter is a complex RFSQ circuit with more than 3000 Josephson junctions. A similar digital filter can be used to increase the digital SQUID performance of the circuitry 130 shown in FIG. 13.

The output of the peripheral electronics is serialized and may be connected to the serial port of a computer (e.g., processor 138) for signal processing.

Another consideration for measurement systems where the digital SQUID device will be used, such as in accelerator beam current measurement systems, is the stray magnetic field in the accelerator environment. The shielding requirements for a digital SQUID is much less severe than that for an analog SQUID, due to its unlimited dynamic range. Any dc magnetic field can be compensated for through feedback. Even slowly varying magnetic fields can be tracked and subtracted out by the digital SQUID. However, transient fields will be measured by the digital SQUID as additional noise. We can use a superconducting (Nb) shield in addition to the standard mu-metal shields to provide better immunity from time-varying stray magnetic fields. Also, the pick-up coil can be designed so as to cancel orthogonal components of magnetic field. Finally, the room-temperature digital filter is a programmable low-pass filter. High frequency noise due to rf magnetic fields will be filtered out by limiting the measurement bandwidth to that of the signal-of-interest (SOI). Since this measurement bandwidth is programmable, it can be altered to maximize the signal to noise ratio of the digital SQUID ammeter.

As noted, systems embodying the invention may include superconducting circuitry for the subranging digital SQUID, peripheral electronics and data analysis software development and system integration.

Figure 15:
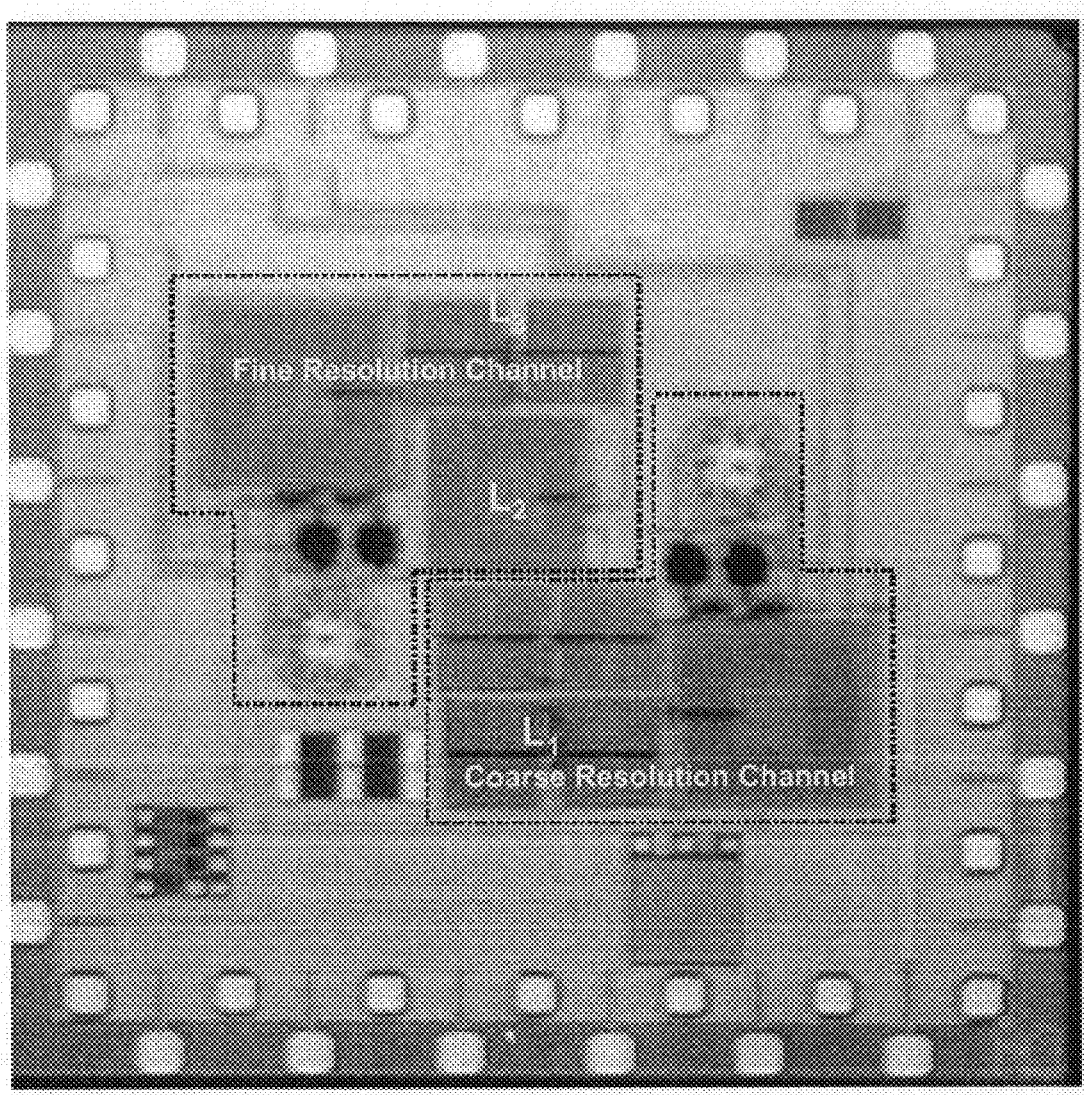
FIG. 15 is a micro-photograph highlighting the placement of the inductors in the layout of a digital SQUID embodying the invention.

The subranging architecture combines a coarse and a fine resolution channel by placing an input coil L1 (e.g., 500-pH) for the coarse channel in series with an input coil L2 (e.g., 1 µH) for the fine channel. An important aspect of the invention is the layout of the two channels on the same chip. A possible layout of L1, L2 and L3 is shown in FIG. 15.

Figure 16:
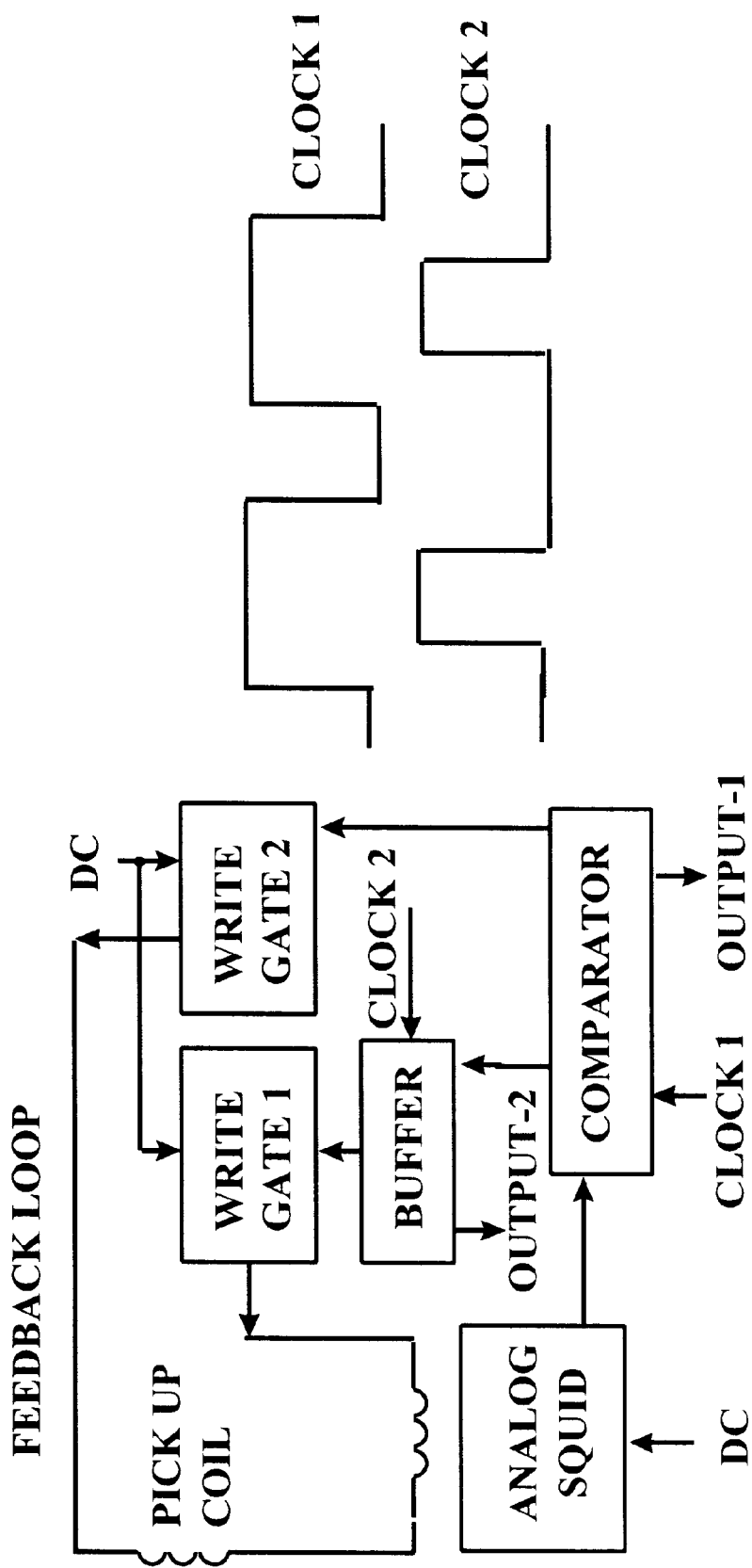
FIG. 16 is a schematic diagram of a two clock comparator which may be used in circuits embodying the invention.

FIG. 16 shows a two-clock comparator which may be used in circuits embodying the invention. However, a comparator with a single-phase clock may be used to clock each one of the "coarse" and "fine" channel comparators as shown in FIGS. 3, 4, 5, 7 and 8.

The output digital signal level from the digital SQUID (D-SQUID) chip is about 1 mV. The peripheral electronics may include any suitable pre-amplifiers (100×) and digital filters. The electronics unit includes a computer interface and may include a computer such as processor 138 [shown in FIGS. 12 and 13.]

Figure 17:
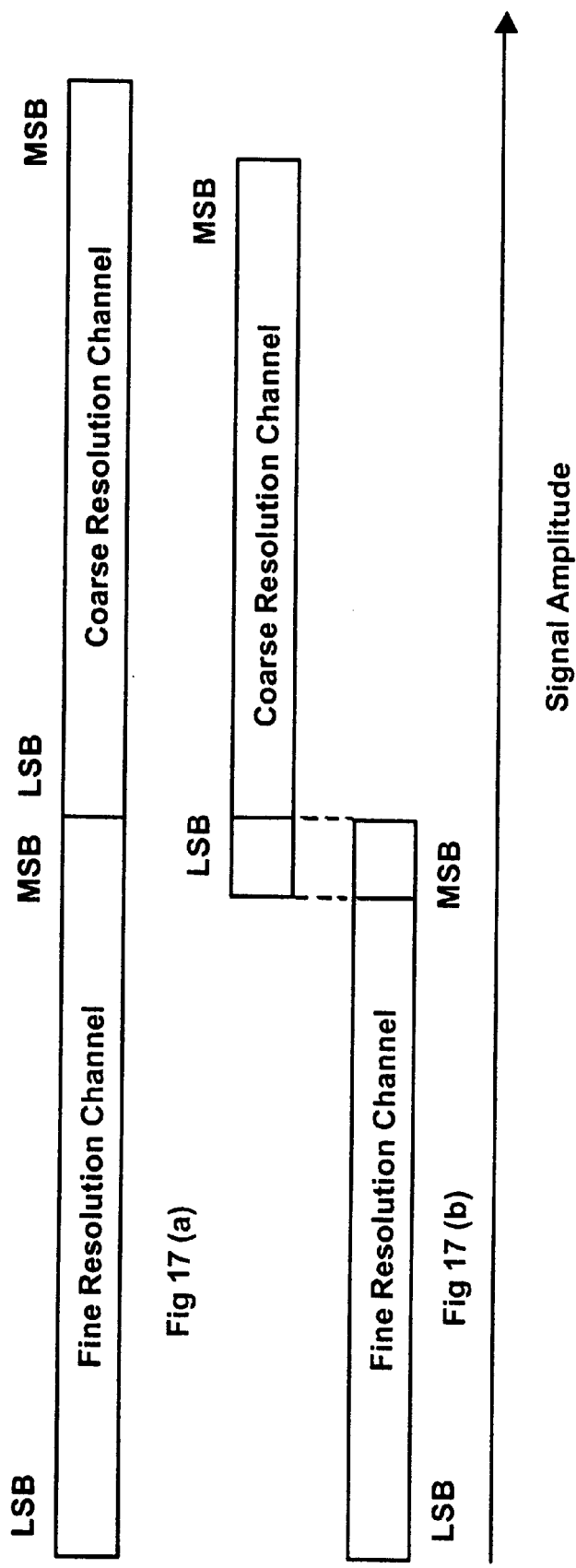
FIG. 17 is an illustrative drawings of two possible schemes for combining the outputs of the fine and coarse resolution channels.

The data analysis for the subranging device is more complicated than that of a single channel device. The data from the coarse and the fine resolution channels must be combined in software and/or via hardware (e.g., processor 138) to produce the complete dynamic range of the signal. One option is to design the channels so that their ranges are non-overlapping, as shown in FIG. 17(a). For this option, the total range is the sum of the two ranges and the two digital numbers from the coarse and fine resolution channels can be concatenated. The other option is to have a slight overlap between the two ranges, as shown in FIG. 17(b), so that the most significant bit(s) (MSB) of the fine channel can be compared to the least significant bit(s) (LSB) of the coarse channel. The second option allows digital error-correction algorithms to be implemented.

FIG. 18 shows how two or more such ADCs can be combined in the subranging architecture through an arrangement of superconducting transformers and delay lines.

An input signal from a pick-up coil is applied to an inductor L1 (for the coarse conversion) and, in parallel thereto, analog delay network 181 in series with an inductor L2 (for the fine conversion). L1 is coupled to a "coarse" SQUID based ADC 183. The output of ADC 183 is coupled to a digital filter 185 and to the input of a digital variable delay line 187. The output of delay line 187 is supplied to a digital-to-analog converter (DAC) 189 whose output is supplied to an inductor L190 which is part of a subtracting network 191. The "coarse" signal produced across L190 is subtracted from the delayed analog input signal across L2. The result of the subtraction is coupled via L192 to the input of a "fine" SQUID band ADC 193. The output of ADC 193 is supplied to the input of a digital filter 195. The outputs of digital filters 185 and 195 are supplied to a processor 198 which functions to reconstruct the signal via the hardware in the processor and its programming. As noted above, there may be more channels than just the "coarse" and "fine" channels shown in FIG. 18.

Figure 19:
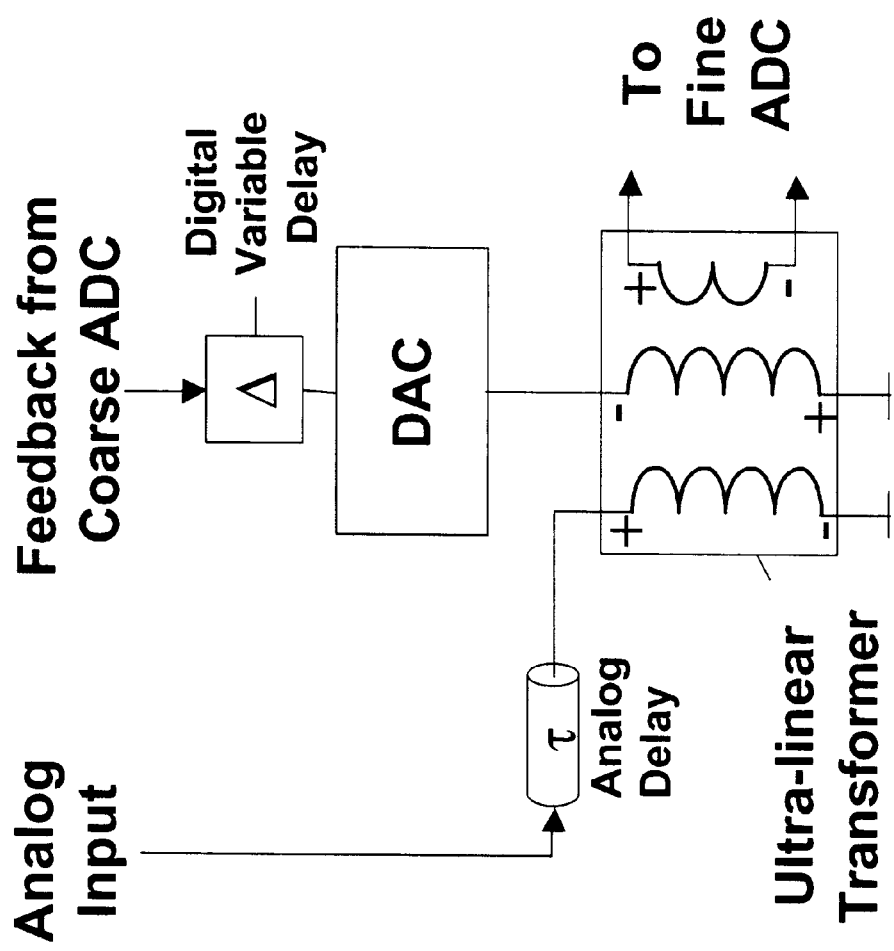
FIG. 19 is a more detailed diagram of the signal subtraction scheme shown in the circuit of FIG. 18.

The feedback path (including delay network 187, DAC 189 and inductor L190) must include a digital-to-analog converter (DAC) with appropriate delay. In the simple 1-bit delta modulator, a DAC is not required. But for multi-bit code generated by a more complex ADC (e.g., 183), a multi-bit DAC is necessary to reproduce the analog signal to be subtracted from the input analog signal. This subtraction can be done by an arrangement of multiple coupled inductors, as shown in FIGS. 18 and 19. This subtractor circuit includes a superconducting transformer with very high linearity. Therefore, the linearity of the analog signal subtraction process will not deteriorate the highly linear superconducting ADC front-end. High-linearity in analog-to-digital conversion produces high spurious free dynamic range (SFDR), an important performance metric for ADCs.

The same input signal is applied to the coarse and the fine ADC. There is a fixed (analog) time delay (due to network 181) in the signal path to the fine ADC 193 to compensate for the processing time of the coarse ADC front-end 183 and the DAC 189. An adjustable digital delay 187(which may be a Josephson transmission line) is introduced between the outptut of ADC 183 and the DAC 189, while the signal is in the digital domain. The adjustable digital delay 187 is introduced to exactly match the timing of the input signal to inductor L2 and the DAC output to inductor L190 so the subtractor 191 works on the correct portion of the signal.

FIG. 18 shows an arrangement where a total dynamic range of 25 bits (or $2^{25}$ or 33 million) is divided into two ranges. However, it should be understood that the subranging architecture could have been extended to more than two ranges. However, most applications can be covered by two to three sub ranges.

Note: FIGS. 18 and 19 are directed to the more general case of "superconducting subranging analog-to-digital converter". The implementation with simple 1-bit delta modulator ADC shown in FIGS. 3, 4–6, 7–9 and 13 and the 2-bit delta in FIGS. 3A and 4A help explain the concept but may be viewed as a subset of the general case illustrated in FIGS. 18 and 19.

Note: A digital SQUID is essentially a euphemism for a superconducting ADC. The analog SQUIDs were originally applied for precision measurement of magnetic fields, currents, etc . . . The simple digital version, with digital feedback is called a digital SQUID; but functionally it is an analog-to-digital converter. This is described, in part, in U.S. Pat. No. 5,420,586 titled Superconducting Analog To Digital Converter Type Circuit issued to M. Radparvar and assigned to Hypres Inc., and the teachings of which are incorporated herein by reference.

The invention may be incorporated in a versatile precision instrument that can be used in a wide variety of measurements in nuclear accelerator beam diagnostics, as well as in other fields. The instrument functions as a precision high-resolution digital ammeter with an extremely large dynamic range by utilizing a digital SQUID technique.

Superconducting electronics have several intrinsic advantages that are exploited by the proposed digital SQUID current measurement instrument.

Quantum Accuracy—The device accuracy is defined by magnetic flux quanta set by a ratio fundamental physical constants $\Phi_0 = h/2e$). Therefore, it is a single fluxon device and can provide quantum mechanical accuracy.

Low Noise—Cryogenic (4 Kelvin) operation ensures reduced thermal noise (75 times smaller than room temperature).

Radiation Hardness—The all-thin-film fabrication technology used for superconducting electronics is intrinsically radiation hard.

Simple Low-cost Fabrication—Implemented in an all thin film process, both the development and fabrication cost per wafer is considerably lower than other semiconductor technologies.

Ultra-high Speed—Even with a 3-$\mu$m fabrication process, complex circuits have been demonstrated, including basic logic gates at 100 GHz and analog-to-digital converters at 20 GHz sampling rates. Gate speed increases with reduction in junction size. Sub-micron logic gates (toggle flip-flops) in the RSFQ technology have even been experimentally demonstrated to operate at >750 GHz—no other technology has even been simulated at this speed.

In applications which do not require measurement of high frequency signals, low-speed room-temperature electronics may be used to perform the necessary digital signal processing. However, this technology can be extended to rf applications, where the signal bandwidth is in the 10 MHz to 10 GHz range, by implementing the digital signal processing hardware in superconducting electronics.

On-chip signal processing circuitry with rapid single flux quantum (RSFQ) logic may be used with this technology.

Digital SQUID technology presents the opportunity to realize a precision current measuring instrument with the following set of attractive features Extremely large dynamic range—Theoretically unlimited, practically limited by the current carrying capacity of superconducting wires High resolution—Raw resolution of 1-2 nA, can be improved to a few pA by over-sampling when the signal bandwidth is small.

Fast slew rate—Slew rate is proportional to the clock frequency.

High sensitivity—Sensitivity, determined by the analog SQUID front-end, is ~$10^{-6}\Phi_0/\sqrt{Hz}$ Programmable measurement bandwidth—By changing the read clock frequency using a programmable decimation counter, the measurement bandwidth can be changed.

Simple and inexpensive room temperature electronics—Room temperature electronics is digital and can be implemented in programmable logic. It is easily extendible to a multi-channel system.

Utilizing a digital SQUID technique in accordance with the invention a precision high-resolution digital ammeter may be formed with an extremely large dynamic range. This type of product will result in a versatile, precision instrument that can be used in a wide variety of measurements in nuclear accelerator beam diagnostics, as well as in other fields. First, we give examples of applications of this instrument for beam diagnostics.

1) A BCM (beam current monitor) measures the total circulating charge in an accelerator and measures any variation over time. Since BCM measures average beam current, it is low bandwidth signal (almost dc). For true dc measurement, a superconducting pick-up coil must be used. This integrates well with a cryogenic superconducting measurement device, a SQUID. The challenge in this measurement is to achieve a very high resolution (at least $10^{-6}$) as well as a very large dynamic range. The digital SQUID ammeter is ideal for this application. Since the slew rate of the signal to be measured is low, the digital SQUID will be able to track the signal with almost unlimited dynamic range. The only limitation on the dynamic range arises from the current carrying capacity of the superconducting pick up coil. However, the current levels in most accelerators range from 100 μA to 100 mA which is well below the current carrying capacity of superconducting wires. In accordance with the invention, a BCM with a raw resolution of 2 nA resolution may be produced. BCM measures average beam current. Therefore, it is low bandwidth signal (almost dc). The resolution will be further improved, by as much as 3 orders of magnitude to 2 pA, by averaging using a room-temperature decimation filter. The large dynamic range will allow measurement of average circulating beam currents in the range of mA with resolution of $10^{-6}$-$10^{-9}$.

2) By implementing a novel subranging architecture, involving alternate clocking of a coarse resolution and a fine resolution digital SQUID, in accordance with the invention, a beam-in-gap (BIG) monitor may be made. The BIG monitor needs to measure a few mA gap currents with a resolution of at least 100 μA. At the same time, it must measure the bunch current which is as large as 100 A.

Therefore, the required dynamic range can be as high as $10^6$ (20 bits). This task is made even more challenging by the fact that the signal bandwidth is in the MHz range. A single digital SQUID would not be able to track the signal over the large dynamic range since the signal slew rate is large. This problem is resolved in accordance with the invention, by subdividing the total dynamic range into two smaller ranges and using two digital SQUIDs. The first (coarse) device measures the signal in larger steps leaving a residual signal that is less than its step size. The second ("fine") device resolves this residual signal in smaller steps, providing the required fine resolution. The coarse and the fine resolution can be adjusted by designing appropriate transformers.

3) Direct measurement of beam polarization may also be possible by improving the resolution to <$10^{-8}$. However, since this must be done with kHz bandwidths, a very high frequency clock (>10 GHz) may be required along with on-chip digital filtering using RSFQ (rapid single flux quantum) logic. This may be achieved by integrating high-speed on-chip clocks and filters with the digital SQUID device.

Note: A three-range device may be necessary to cover the 27 bit dynamic range, required for this application. The proposed sub-ranging technique embodying the invention is extendible to additional channels (i.e., more than just a single coarse and fine channel may be used in circuits and systems embodying the invention to process the input signal).

The invention is not restricted to measurement of current. The invention may be used to make a high precision magnetometer or voltmeter. SQUID magnetometers are widely used for non-destructive evaluation and non-invasive biomagnetic measurements. Significant cost reduction in such systems may be facilitated by the use of a digital SQUID instead of the analog SQUID that is currently used. The room temperature electronics is much simpler in the case of digital SQUID and the large dynamic range obviates the need for expensive shielded rooms that are needed by present SQUID magnetometer systems.

Commercial SQUID magnetometers are widely used as biomagnetic sensors to measure weak magnetic fields in heart muscle (magnetocardiogram), in the brain (magnetoencephalogram), and in skeletal muscle (magnetomyogram). Existing SQUID systems use conventional RF and DC SQUIDs with room-temperature electronics. The field imposed on the SQUID is transformed to a voltage by the SQUID and is sensed by an electronic circuit. SQUID magnetometer systems developed for biomedical applications use shielded rooms with walls several inches thick. The major single-item cost of most SQUID-based biomedical systems is associated with this elaborate magnetic shielding. The digital SQUID system embodying the invention, because of its large dynamic range, is capable of discriminating weak signals against large non-varying ambient fields and will not require elaborate shielding. Thus the cost of such systems can be significantly reduced by using the digital SQUID approach.

There are several military applications, such as electronic warfare (EW) and signal intelligence (SIGINT) systems, where very large dynamic range and resolution are required.

In SIGINT systems, the signal of interest must be discriminated from other interfering signals and noise. For this application, a dynamic range of 20-25 bits (120-150 dB) is required over a bandwidth of 5-10 MHz. This task is similar to the BIG monitor, except that both the large and small signals of interest occur at the same time. The subranging digital SQUID technology is suitable for these SIGINT systems. To achieve better resolution over larger bandwidth, a multi-comparator ADC and a digital-to-analog converter (DAC) may be used before the signal is fed back to the input. High-resolution ADC and ultra-linear DAC circuits utilizing the quantum accuracy feature of the superconducting electronics manufactured by the assignee of the present invention may be used to practice and/or in conjunction with the present invention. These can be incorporated into the subranging architecture to achieve higher performance digital SQUIDs. The development of such systems will enable the realization of higher performance devices.

In EW systems, the problem is detection of unintentional modulation of pulsed radars. This application demands even higher bandwidth (25-100 MHz) with >100 dB dynamic range and 96 dB signal-to-noise ratio (SNR), equivalent to about 16 bits of resolution. Again, a high-performance subranging digital SQUID is well suited for this application. Fast RSFQ on-chip signal processing circuits may be used to provide higher performance.

The subranging architecture can be implemented using any number of suitable analog-to-digital converters (ADCs). The description in FIG. 3 was for a single-comparator ADC or a 1-bit delta modulator. Increased slew rate (more bits at higher bandwidth) may be obtained by using more complex ADCs with on-chip fast digital filters (as an example, see FIG. 14 which is a micro-photograph of the high resolution analog-to-digital circuit). A high resolution ADC may also be of the type shown in an article titled "Progress in the Development of a Superconductive High-Resolution ADC", by Mukhanov, Brock, Kirichenko, Rylov and Vogt published in Extended Abstracts 1999 Intl. Supercond. Elec. Conf. (ISEC'99).

What is claimed is:

1. A subranging superconducting analog-to-digital converter (ADC) comprising: means for applying an analog input signal to an input coil having at least a first inductive section and a second inductive section;
   a first superconducting quantum interference device (SQUID), coupled to said first inductive section, responsive to said analog input signal for producing a first output signal;
   a first comparator responsive to said first output signal of the first SQUID and to a first clock signal for producing a first output signal which is coupled back to said input coil;
   a second superconducting quantum interference device (SQUID), coupled to said second inductive section, responsive to said analog input signal for producing a second output signal; and
   a second comparator responsive to said second output signal of the second SQUID and to a second clock signal for producing a second output signal which is coupled back to said input coil.

2. The subranging superconducting ADC as claimed in claim 1, wherein said first and second clock signals are applied to said first and second comparators for enabling one of them at a time.

3. The subranging superconducting ADC as claimed in claim 1, wherein the inductance of the second inductive section is greater than the inductance of the first inductive section;
   wherein the first SQUID and the first comparator are designed to produce a coarse, low resolution, output; and
   wherein the second SQUID and the second comparator are designed to produce a fine, high resolution, output.

4. The subranging superconducting ADC as claimed in claim 3, wherein each one of said first and second comparators is a superconducting comparator; with each one of said first and second comparators being responsive to an output signal of its corresponding SQUID and to a clock signal for producing a first output signal having a first value and a second output signal having a second value, complementary to said first value;
   the first output signal being coupled to a first write gate and the second output signal being coupled to a second write gate;
   the first write gate producing a comparator output signal of one value and the second write gate producing a comparator output signal of complementary value; and
   wherein the two output signals of the first and second comparators are coupled back to the input coil.

5. The subranging superconducting ADC as claimed in claim 4, wherein each one of said first and second SQUIDs has an output for respectively producing said first and second output signals; and wherein each output includes an output coil for inductively coupling the output signals of each SQUID to an input of its corresponding comparator.

6. The subranging superconducting ADC as claimed in claim 5, wherein the second inductive section of the input coil is coupled to an input of the second SQUID via an isolation transformer.

7. The subranging superconducting ADC as claimed in claim 5, wherein each one of said first and second comparators produces a digital output, with the digital output of the first comparator defining the more significant bits and the digital output of the second comparator defining the lesser significant bits of the digitally converted signal.

8. The subranging superconducting ADC as claimed in claim 7, wherein the digital output of each comparator is coupled to an up-down counter, each up-down counter having an output coupled to an accumulator whose output is coupled to a processor for combining the outputs derived from the first and second comparators.

9. The subranging superconducting ADC as claimed in claim 8, wherein the accumulator is responsive to a clock signal derived from a master clock and the first and second clock signals are derived from the same master clock.

10. The subranging superconducting ADC as claimed in claim 7, wherein the digital output of each comparator is a 1-bit delta code.

11. The subranging superconducting ADC as claimed in claim 10, wherein the 1-bit delta code output from each comparator is applied to a gate circuit for converting each 1-bit delta code output into a differential code applied to an up-down counter.

12. The subranging superconducting ADC as claimed in claim 1, wherein each one of said first and second SQUIDs is an analog SQUID.

13. The subranging superconducting ADC as claimed in claim 1, wherein the first and second inductive sections are connected in series and wherein the inductance of the second inductive section is greater than the inductance of the first inductive section.

14. The subranging superconducting ADC as claimed in claim 1, wherein the first comparator produces a first quantized output signal and the second comparator produces a second quantized output signal.

15. The subranging superconducting ADC as claimed in claim 3, wherein each one of said first and second comparators is a superconducting comparator;
   with each one of said first and second comparators being responsive to an output signal of its corresponding SQUID and to a clock signal for producing a first output signal having a first value and a second output signal having a second value, complementary to said first value;
   the first output signal being coupled to a first write gate and the second output signal being coupled to a second write gate;
   the first write gate being settable to a first threshold level and the second write gate being settable to a second threshold level for enabling the first and second write gates to produce an output signal having:
   (a) a first value when the input signal to the comparator is greater than the first threshold level,
   (b) a second value when the input signal is below the second threshold level, and (c) a third value when the input signal is between the first and second threshold levels; and wherein the output signals of the first and second comparators are coupled back to the input coil.

16. The subranging superconducting ADC as claimed in claim 15, wherein each write gate includes a SQUID with means for selectively applying a different bias current to each write gate SQUID.

17. A subranging superconducting analog to digital converter (ADC) comprising:
  means for applying an input signal to an input coil having at least a first inductive section in series with a second inductive section;
  a first superconducting quantum interference device (SQUID) coupled to said first inductive section responsive to an input signal for producing a first output signal;
  a first comparator responsive to said first output signal of the first SQUID for producing a quantized signal of a polarity to subtract a first fixed amount from the input signal;
  a second superconducting quantum interference device (SQUID) coupled to said second inductive section responsive to an input signal for producing a second output signal;
  a second comparator responsive to said second output signal of the second SQUID for producing a quantized signal of a polarity to subtract a second fixed amount from the input signal.

18. A subranging superconducting ADC as claimed in claim 17, wherein a clock signal is applied to said first and second comparators for enabling one of them at a time.

19. A subranging superconducting ADC as claimed in claim 18, wherein:
  (a) the first comparator has an input connected to said output of said first SQUID and has a first coarse output coupled to said input coil and a second coarse output at which is produced a first digital signal;
  (b) the second SQUID is coupled via an isolation transformer to said second section of said input coil; and
  (c) the second comparator has an input coupled to said output of said second SQUID and has a first fine output coupled to said isolation transformer and a second fine output at which is produced a second digital signal.

20. A subranging superconducting ADC as claimed in claim 19, wherein the outputs of the first and second comparators are processed and combined to produce a full digital representation of the analog input signal.

21. A subranging superconducting ADC as claimed in claim 18, wherein the inductance of the second inductor is greater than the inductance of the first inductor.

22. A subranging superconducting analog to digital converter (ADC) including:
  means for applying an analog input signal to an input coil having at least a first inductive section and a second inductive section;
  a first superconducting quantum interference device (SQUID) having an input coupled to said first inductive section and having an output coupled to an input of a first comparator, said first comparator having an output for producing a first signal when the analog input signal exceeds a first reference level and for producing a second signal when the analog input signal does not exceed said reference level;
  a second superconducting quantum interference device (SQUID) having an input coupled to said second inductive section and having an output coupled to an input of a second comparator, said second comparator having an output for producing a third signal when the analog input signal exceeds a second reference level and for producing a fourth signal when the input signal does not exceed said second reference signal; and
  means coupling the outputs of the first and second comparators to the input coil.

23. A subranging superconducting analog-to-digital converter (ADC) comprising:
  input means for applying an analog input signal to a first inductor;
  first means inductively coupling the first inductor to an input of a "coarse" SQUID based ADC for producing at an output thereof a coarse, low resolution, output signal;
  means coupling an output of the "coarse" SQUID based ADC to a first digital filter
  means coupling an output of the "coarse" SQUID based ADC via a digital variable delay line to a digital-to-analog converter (DAC);
  means for coupling the analog input signal via an analog delay network to a second inductor;
  means coupling an output of the DAC to a third inductor arranged to subtract the DAC output from the analog input signal supplied to the second inductor;
  means coupling signals resulting from the subtraction to an input of a "fine" SQUID based ADC for producing at an output thereof a fine, high resolution, output signal;
  means coupling an output of the "fine" SQUID based ADC to a second digital filter; and
  means coupling the outputs of the first and second digital filters to a processor for reconstructing the input signal.

24. The subranging superconducting analog-to-digital converter (ADC) as claimed in claim 23, wherein the analog delay network delays the propagation of the input signal for a length of time which is approximately equal to the time taken to process the input signal through the "coarse" SQUID based ADC, the digital variable delay network and the DAC.

25. The subranging superconducting analog-to-digital converter (ADC) as claimed in claim 23, wherein the digital variable delay network may be controlled to ensure that the time taken to process the input signal through the "coarse" SQUID based ADC and, the digital variable delay network and the DAC matches precisely the delay through the analog delay network.

26. A subranging superconducting ADC comprising:
  means supplying an analog input signal to first and second circuit networks;
  said first circuit network including a first inductor for coupling the analog input signal to a first SQUID circuit for producing "coarse" (high amplitude, low resolution) output signals in response to said analog input signal;
  a subtractor network for subtracting from the analog input signal a signal corresponding to an output of the first SQUID and for supplying the resultant signal to an input of a second SQUID circuit for producing "fine" (low amplitude, high resolution) output signals in response to said analog input signal; and
  neans coupling an output from each one of said first and second SQUIDs to a digital filter.

27. A subranging superconducting ADC as claimed in claim 26, wherein, the circuitry for subtracting an output of the first SQUID based circuit from the analog input signal includes an analog delay line for coupling the analog input signal to a second inductor and a digital variable delay network having an input connected to the output of the first SQUID based circuit and having an output connected to the input of a digital-to-analog converter (DAC) with the output of the DAC being connected to a third inductor and supplying a signal thereto tending to cause the output of the first SQUID based circuit to be subtracted from the analog input signal developed across the second inductor.

* * * * *